United States Patent
Tang et al.

(10) Patent No.: US 11,543,556 B2
(45) Date of Patent: Jan. 3, 2023

(54) NMR CHARACTERIZATION AND MONITORING OF DRILLING FLUIDS

(71) Applicant: Schlumberger Technology Corporation, Sugar Land, TX (US)

(72) Inventors: Yiqiao Tang, Belmont, MA (US); Reda Karoum, Houston, TX (US); Yi-Qiao Song, Newton Center, MA (US); Shin Utsuzawa, Sugar Land, TX (US); Stephen Cliffe, Houston, TX (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 0 days.

(21) Appl. No.: 16/995,325

(22) Filed: Aug. 17, 2020

(65) Prior Publication Data

US 2022/0050223 A1 Feb. 17, 2022

(51) Int. Cl.
*G01V 3/32* (2006.01)
*G01N 24/08* (2006.01)
*E21B 49/08* (2006.01)
*G01R 33/44* (2006.01)

(52) U.S. Cl.
CPC ............. *G01V 3/32* (2013.01); *E21B 49/088* (2013.01); *E21B 49/0875* (2020.05); *G01N 24/081* (2013.01); *G01R 33/448* (2013.01)

(58) Field of Classification Search
CPC ..... G01V 3/32; E21B 49/0875; E21B 49/088; G01N 24/081; G01R 33/448
See application file for complete search history.

(56) References Cited

U.S. PATENT DOCUMENTS

| | | | |
|---|---|---|---|
| 6,229,308 B1 * | 5/2001 | Freedman | G01V 3/32 324/303 |
| 9,194,972 B2 | 11/2015 | Van Der Zwaag et al. | |
| 9,777,542 B2 | 10/2017 | Stock et al. | |
| 10,527,566 B2 | 1/2020 | McCarthy et al. | |
| 11,047,812 B2 | 6/2021 | Li | |
| 11,047,815 B2 | 6/2021 | Reiderman | |
| 2009/0128144 A1 * | 5/2009 | Freedman | G01R 33/3806 324/303 |

(Continued)

FOREIGN PATENT DOCUMENTS

| | | |
|---|---|---|
| CN | 110412064 A | 11/2019 |
| CN | 210803751 U | 6/2020 |
| WO | 2019222300 A1 | 11/2019 |

OTHER PUBLICATIONS

Callaghan, P. T., "Rheo-NMR: nuclear magnetic resonance and the rheology of complex fluids" Reports on Progress in Physics, 1999, 62(4), pp. 599-670.

(Continued)

*Primary Examiner* — Susan S Lee

(57) ABSTRACT

A method for evaluating drilling fluid includes making an NMR measurement of a sample of the drilling fluid and inverting the measurements to compute a corresponding T1T2 plot. The T1T2 plot is in turn evaluated to characterize the drilling fluid. In one embodiment, a stability index of the fluid may be computed from multiple NMR measurements made while aging the sample.

20 Claims, 22 Drawing Sheets
(16 of 22 Drawing Sheet(s) Filed in Color)

(56) References Cited

U.S. PATENT DOCUMENTS

| | | |
|---|---|---|
| 2016/0047936 A1* | 2/2016 | Ali .................. G01R 33/448 |
| | | 324/303 |
| 2017/0248732 A1 | 8/2017 | Song et al. |
| 2020/0174153 A1* | 6/2020 | Song .................. G01V 3/32 |
| 2020/0301039 A1 | 9/2020 | Donaldson et al. |
| 2022/0178253 A1 | 6/2022 | Reda et al. |

OTHER PUBLICATIONS

Chen, J. J., et al. "Dispersion of T1 and T2 Nuclear Magnetic Resonance Relaxation in Crude Oils", ChemPhysChem, 2014, 15(13), pp. 2676-2681.

Hürlimann, M. D. et al., "Hydrocarbon Composition from NMR Diffusion and Relaxation Data", Petrophysics, 2009, vol. 50(2), pp. 116-129.

Li, S. et al., "A novel NMR instrument for real time drilling fluid analysis", Microporous and Mesoporous Materials, 2018, 269, pp. 138-141.

O'Neill, R. E et al., "Liquid migration in shear thickening suspensions flowing through constrictions", Physical Review Letters, 2019, 5 pages.

Rismanto, R. et al., "Explorative Study of NMR Drilling Fluids Measurement", Annual Transactions of the Nordic Rheology Society, 2007, 15, 7 pages.

Utsuzawa, S. et al., "Unilateral NMR with a barrel magnet", Journal of Magnetic Resonance, 2017, 282, pp. 104-113.

U.S. Appl. No. 63/364,849, filed May 17, 2022, 42 pages.

\* cited by examiner

NMR CHARACTERIZATION AND MONITORING OF DRILLING FLUIDS

CROSS REFERENCE TO RELATED APPLICATIONS

None.

FIELD OF THE INVENTION

Disclosed embodiments relate generally to characterization and monitoring of drilling fluids and more particularly to nuclear magnetic resonance (NMR) methods for characterizing and monitoring drilling fluids.

BACKGROUND INFORMATION

The use of nuclear magnetic resonance (NMR) measurements in oilfield applications is well known, for example, to evaluate drilling fluid or formation core samples as well as to make downhole measurements in the wellbore. Such techniques may be utilized to determine various characteristics of porous subterranean formations and to assist in the determination of, for example, the presence, absence, location, mobility, and producibility of hydrocarbons in the formation.

NMR measurements are made by applying a strong, polarizing, static magnetic field (the longitudinal magnetic field) to a sample (such as a drilling fluid or formation core sample). This field causes the proton spins to align in a direction parallel to the applied field. A series of radio frequency (RF) pulses are then transmitted into the sample to rotate the magnetization into the transverse plane. Carr-Purcell-Meiboom-Gill (CPMG) pulse sequences are commonly employed in downhole and oilfield applications. The RF pulses generate a series of spin echoes that bear information about various properties of the interrogated sample such as volumes of liquids, their relaxation times, and diffusion properties.

Time constants T1 and T2 are commonly evaluated in NMR measurements. The spin-lattice relaxation time T1 (also referred to as the longitudinal polarization time) is the time constant for the longitudinal magnetization to return to its thermal equilibrium value in the static magnetic field. The spin-spin relaxation time T2 (also referred to as the transverse polarization time) is the time constant for the transverse magnetization to return to its thermal equilibrium value of zero. Diffusion coefficients of the liquids in the formation are also known to influence the relaxation processes. Distributions of these relaxation times may be inferred from the amplitudes of the measured spin echoes by T1, T2, and diffusion inversions. Such inversions (generally Laplacian inversions) may provide both one-dimensional distributions of any of those quantities and/or multi-dimensional joint distributions of any subset of them.

As is known to those of ordinary skill, drilling fluids are highly complex multi-phase fluids. Drilling fluids are subject to high temperature and high pressure conditions and commonly undergo phase separation or other molecular dynamics during static aging (at ambient or high temperature high pressure conditions). Drilling fluids may further undergo significant changes with the addition of new or different components at various concentrations. There is a need for additional and improved methods for evaluating drilling fluids using NMR.

SUMMARY

In a first embodiment, a method for evaluating drilling fluid is disclosed. The method includes obtaining a sample of the drilling fluid and causing an NMR measurement system to make a plurality of an NMR measurements of the sample at a corresponding plurality of times while the sample ages. Each of the NMR measurements is inverted to obtain corresponding T1T2 plots which are processed in combination to compute an NMR stability index of the drilling fluid. The NMR stability index is indicative of a stability of the drilling fluid during aging.

In a second embodiment, a method for evaluating drilling fluid is disclosed. The method includes obtaining a sample of the drilling fluid and titrating (measuring) at least first and second concentrations of an additive into corresponding first and second sub-samples of the sample of the drilling fluid to obtain corresponding first and second modified samples. An NMR measurement system is used to make NMR measurements of the sample and the first and second modified samples. The NMR measurements are then inverted to obtain a corresponding plurality of T1T2 plots which are further evaluated to characterize the drilling fluid, for example, to determine which of the peaks in the T1T2 plots correspond to a based oil which corresponding to a water based brine.

In a third embodiment, a method for evaluating drilling fluid is disclosed. The method includes obtaining a sample of drilling fluid and a modified sample of the drilling fluid wherein the sample includes a water based brine and the modified sample includes a deuterium oxide ($D_2O$) based brine replacing the water based brine. An NMR measurement system is used to make NMR measurements of the sample and the modified sample. The measurements are inverted to obtain corresponding T1T2 plots. Peaks in the T1T2 plots are compared to separate contributions from oil based components and water based components of the sample drilling fluid.

This summary is provided to introduce a selection of concepts that are further described below in the detailed description. This summary is not intended to identify key or essential features of the claimed subject matter, nor is it intended to be used as an aid in limiting the scope of the claimed subject matter.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

For a more complete understanding of the disclosed subject matter, and advantages thereof, reference is now made to the following descriptions taken in conjunction with the accompanying drawings, in which:

FIGS. 14-16 depict aging cell configurations in which FIG. 14 depicts a configuration in which samples are collected at 2 heights on one aging cell, FIG. 15 depicts a configuration in which samples are collected at 2 heights on two aging cells, and FIG. 16 depicts a configuration in which samples are collected at 2 heights on the aging cells.

DETAILED DESCRIPTION

Figure 1:
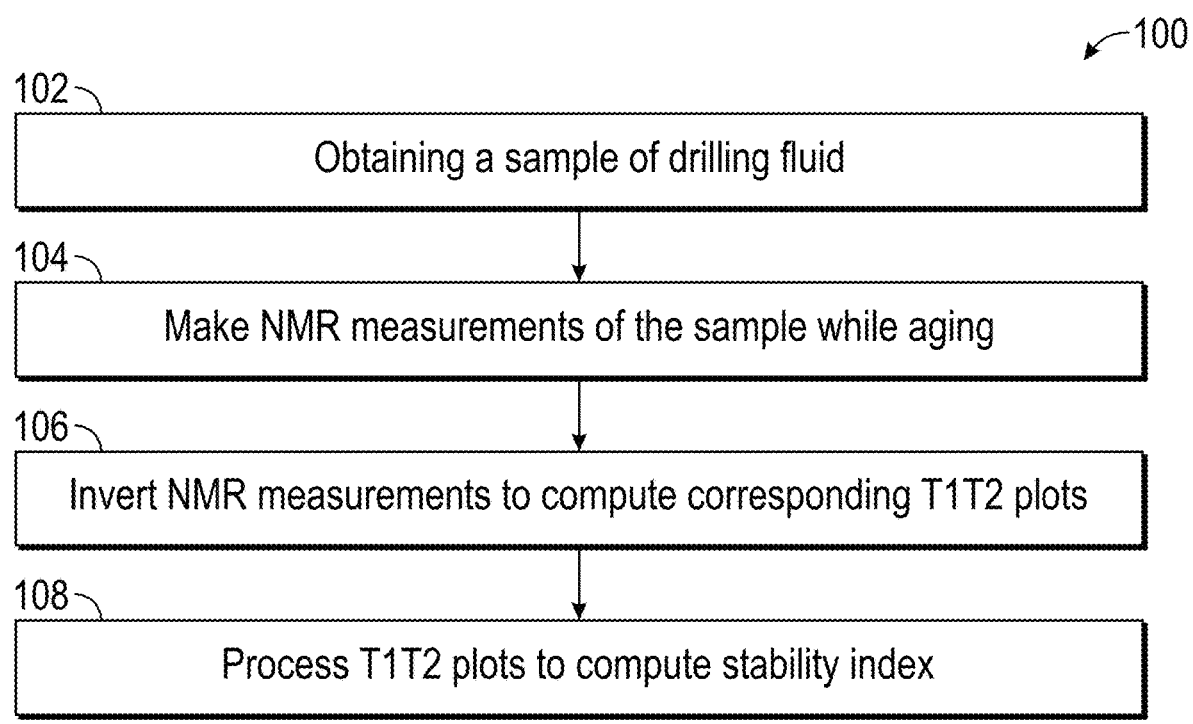
FIG. 1 depicts a flow chart of one disclosed method embodiment.

As described above in the Background section of this disclosure, NMR is a measurement technology commonly used in oilfield applications to evaluate porous media and complex fluids. Embodiments included herein may utilize NMR relaxometry-based technology to characterize drilling fluids in various application scenarios.

Oilfield NMR generally evaluates hydrogen spins in fluids, which when subject to an external static magnetic field embody two distinctive energy levels with a small gap $\Delta E$. Upon applying an AC magnetic field at frequency $f=\Delta E/h$ (where h is the Planck's constant) for a definite time, a spin resonance is created and as a result an NMR signal is excited. The resonance condition may be further controlled through a set of AC and DC magnetic-field pulses in the time domain. For a specific time sequence of AC/DC pulses, the evolution of NMR signal relates to certain fluid characteristics.

NMR investigates fluid dynamics at a molecular level, and therefore is intrinsically sensitive to properties of fluid molecules themselves and their surroundings. Particularly, at the operating frequency of a few to tens of MHz in the oil field, the NMR method is virtually unaffected by the presence of emulsions thanks to the substantially longer wavelength of RF used than the size of dispersed droplets under study. The intrinsic physics makes NMR a suitable tool to investigate complex fluids of multiple phases.

Because of the measurement robustness and molecular sensitivity, NMR has long been used to study emulsion samples, including at elevated temperature and pressure conditions. In fact, there exist significant correlations between NMR signatures and emulsion stability, such as through measuring relaxation time and diffusion coefficients of fluid molecules to deduce clay concentration and distribution, droplet size and distribution, and solid content.

Notwithstanding the usefulness of prior methods, drilling fluids can undergo significant changes while aging as well as with the addition of new or different components at various concentrations. There is a need for additional and improved methods for evaluating drilling fluids using NMR.

Disclosed methods for evaluating drilling fluid include making an NMR measurement of a sample of the drilling fluid and inverting the measurements to compute a corresponding T1T2 plot. The T1T2 plot is in turn examined to evaluate the drilling fluid. For example, a stability index of the fluid may be computed from multiple NMR measurements made while aging the sample. The disclosed embodiments are described in more detail below with respect to the accompanying FIGS.

The disclosed embodiments may provide various technical advantages. For example, the disclosed methodology may provide for improved characterization of drilling fluids, for exampling, to characterize the stability of the fluid and/or to provide better understanding of the role of the various drilling fluid components (e.g., the oil, the brine, solids, the emulsifier, and other additives) to the fluid performance.

The disclosed embodiments include methods for evaluating drilling fluids. In certain embodiments, the method may be used to evaluate pristine (unused) drilling fluid. For example, the disclosed embodiments may be used to evaluate the aging and separation of the fluids. Alternatively and/or additionally the method may be used to evaluate used (or in service) drilling fluid (e.g., possibly including formation fluids, cuttings, and other materials in addition to the original drilling fluid). Such fluids may be obtained from a drilling rig, for example, from a subterranean wellbore, a mud pit, or elsewhere on the rig. The disclosed embodiments are not limited in these regards.

FIG. 1 depicts a flow chart of one disclosed method embodiment 100 for evaluating drilling fluid. The method 100 includes obtaining a sample of the drilling fluid at 102, for example, from a drilling rig or some other drilling fluid source. The method 100 further includes using an NMR measurement system to make a plurality of NMR measurements at 104 of the obtained sample at a corresponding plurality of times while the sample ages. For example, the NMR measurements may be obtained at 1 day intervals over a period of 1 week (more or less). The sample may be aged at ambient conditions (e.g., at ambient temperature and pressure) or at high temperature and/or pressure conditions (e.g., at a temperature above 100 degrees C.). Likewise the measurements may be made at ambient conditions or at elevated temperature and/or pressure conditions. For example, in one embodiment, the sample may be aged in a high temperature chamber. In such embodiments, the NMR measurement system may be fully or partially deployed in the chamber such that components of the NMR system (e.g., the DC magnetic and/or the radio frequency antenna) are at substantially the same temperature as the sample.

The NMR measurements are inverted at 106 to compute a T1 versus T2 plot (a T1T2 plot) corresponding to each of the NMR measurements. These T1T2 plots are then processed in combination to compute an NMR stability index of the sample at 108. As described in more detail below, the NMR stability index may be thought of as being a quantitative index indicative of a stability (or instability, e.g., via gel breakdown and collapse) of the drilling fluid sample obtained in 102.

As described above with respect to FIG. 1, method 100 is intended analyze fluid signatures of NMR T1T2 spectra of drilling fluids over some predetermined time period (e.g., at fixed time intervals over the time period). When an emulsion breaks down, the oil phase may coalesce into a continuous bulk state. Owing to the changing chemical environment, this "free oil" embodies a distinctive NMR signature from the emulsified fluid. One way to quantify the sagging (or aging) process is to track the free oil fraction over time in the aging drilling fluid. As used herein, "free oil" refers to the portion of base oil that is different (from a fluid fabric point of view) from its fully emulsified counterpart. It will be understood that the free oil is not necessarily the distinctive layer of translucent oil in a well-aged sample.

Besides the emergence of free oil with its distinctive signature, the NMR spectra may also reveal a temporal evolution of other fluid species. In certain embodiments, the NMR stability index may quantify the overall evolution of the T1T2 plots with time, for example, to capture the full fluid dynamics of the sample with aging. For example, the cumulated difference between T1T2 plots may be computed over time. The index may then be used to compare various drilling fluids, for example, drilling fluids having the same chemical components but different concentrations of the components. In the aforementioned embodiments, the relative positions and amplitudes of peaks in the T1T2 plots may be indicative of the state of aging (or aged) drilling fluid so that evaluating changes in the positions and amplitudes of may be used to quantify changes in the sample with time.

The stability index may be configured such that an increasing index indicates increasing change between the T1T2 plots with aging. In such embodiments, an increasing stability index is indicative of an increasing tendency of the drilling fluid sample to sag (e.g., for certain components to coalesce) with time. It will be understood that numerous mathematical constructs are applicable to quantify the similarity (or difference) between spectra or plots such as the T1T2 plots used herein. In certain advantageous embodiments, the stability index quantifies changes to the T1T2 plots using a Bhattacharyya distance ($D_B$) computation, which is defined mathematically, for example, as follows:

$$D_B(sp_2, sp_1) = -\ln\left[\Sigma\sqrt{sp_1 * sp_2}\right]$$

where $sp_1$ and $sp_2$ represent first and second normalized T1T2 plots, * represents element-wise multiplication, and the summation is over the entire domain of the T1T2 plot. When the two T1T2 plots ($sp_1$ and $sp_2$) are identical then $D_B = 0$. Increasing differences between the two T1T2 plots are indicated by an increasing $D_B$.

In embodiments, in which the drilling fluid sample is aged over multiple intervals (e.g., at 1 day intervals for three or more days), the stability index may be configured to cumulate the evolution (or change) in the T1T2 plots over time. In one advantageous embodiment, the stability index may be defined mathematically, for example, as follows:

$$SI_{NMR}(k) = \sum_{k=1}^{N} -\ln\left[\sum \sqrt{sp_1 * sp_k}\right]$$

where $SI_{NMR}(k)$ represents the NMR stability index of the sample, N represents the number of sequential measurements over time with k=1, 2, ..., N representing individual ones of the N measurements, $sp_1$ ... $sp_k$ represent the normalized T1T2 plots, * represents element-wise multiplication, and the summation is over the entire domain of the T1T2 plot.

In certain optional embodiments it may be advantageous to obtain first and second samples in 102. For example, a first sample including a water based brine and second sample including a deuterium oxide ($D_2O$) based brine may be obtained. In such embodiments the second sample may be essentially identical to the first sample with the exception of the brine composition (the $D_2O$ based brine replaces the water based brine). Further comparison of the T1T2 plots obtained from the first sample and the second sample may enable the contributions of oil based components and water based components in the drilling fluid to be separated (initially and/or as the sample ages). In general water based peaks are absent in the T1T2 plots for the sample including the $D_2O$ based brine thereby enabling peaks related to the oil-based components to be readily identified.

In embodiments employing a $D_2O$ based brine, method 100 may further include computing first and second stability indexes based on NMR measurements made while aging the drilling fluid including the water based brine and NMR measurements made while aging the drilling fluid including the $D_2O$ based brine. In such embodiments, the first stability index is indicative of the drilling fluid as a whole (including the oil based components, the water based components, and any solids). The second stability index is indicative of the stability of the drilling fluid absent the water based brine (i.e., including the oil based components and any solids). Such measurements enable the source of drilling fluid instability to be better identified, for example, to the water based brine, to the base oil, or to some interaction between these components. It may be advantageous in such embodiments to further compute a ratio or a difference of the first and second stability indexes to better characterize the fluid using a single parameter.

Figure 2:
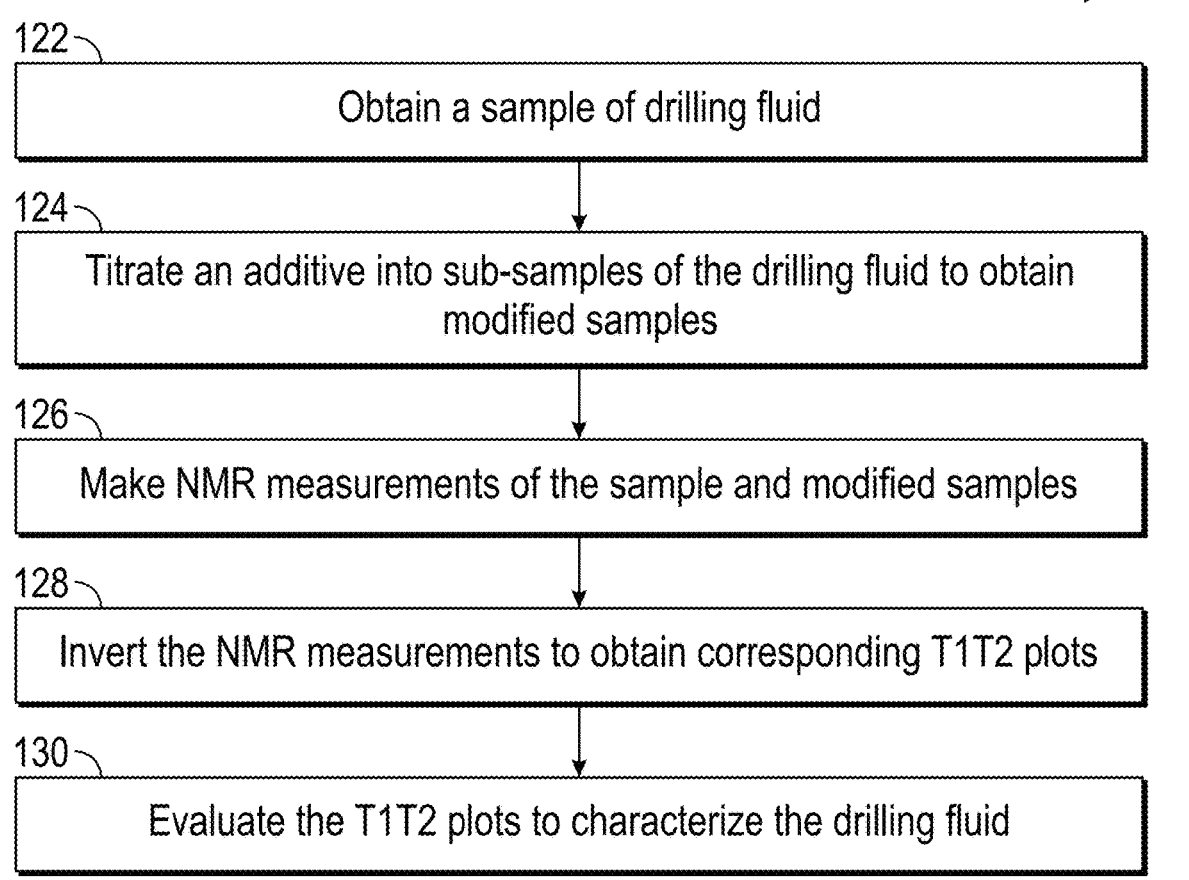
FIG. 2 depicts a flow chart of another disclosed method embodiment.

FIG. 2 depicts a flow chart of another disclosed method embodiment 100 for evaluating drilling fluid. The method 120 includes obtaining a sample of the drilling fluid at 122, for example, from a drilling rig or some other drilling fluid source as described above with respect to FIG. 1. The method further includes titrating (i.e., measuring) at least first and second concentrations of an additive into corresponding first and second sub-samples of the sample of the drilling fluid to obtain corresponding first and second modified samples at 124 (e.g., first, second, and third concentrations of the additive into corresponding first, second, and third sub-samples or first, second, third, and fourth concentrations of the additive into corresponding first, second, third, and fourth sub-samples). While the disclosed embodiments are not limited in this regard, the additive may advantageously include a component of the drilling fluid, for example, including an oil based component, water based brine, an emulsifier, an anti-sagging agent, a wetting agent, and/or barite (such as a wetted barite, a barite having the same particles size distribution or a different particle size distribution, or a precipitated barite). In example embodiments described in more detail below, the additive includes oil.

An NMR system is used to make NMR measurements of the sample of drilling fluid and the first and second modified samples (including the additive) at 126, for example, as described above with respect to FIG. 1. The NMR measurements may be inverted to obtain corresponding T1T2 plots at 128 as also described above.

The T1T2 plots are evaluated at 130 to characterize the drilling fluid. For example, evaluating the T1T2 plots may include evaluating changes in positions and amplitudes of corresponding peaks in the T1T2 plots to separate peaks related to oil-based components of the drilling fluid and water based components of the drilling fluid. The amplitude and position (in T1T2 space) tends to change depending on the type and amount of additive titrated into the sample(s). For example, addition of an oil (or oil based) additive will generally increase the amplitude (and may also shift the position) of peaks corresponding to oil based components of the drilling fluid.

In certain embodiments, method 120 may further include (or evaluating the T1T2 plots in 130 may further include) determining a mathematical correlation between the additive concentrations in 124 and features of the T1T2 plots obtained in 128 (e.g., positions and/or amplitudes of the various T1T2 peaks). The correlation may then be used to compute an oil water ratio, a solid content, an emulsifier concentration, and/or a wetting agent concentration of the original drilling fluid sample obtained in 122.

In certain advantageous embodiments, the additive includes a component of the drilling fluid such as an oil based component, a water based brine, or a solid barite component. In such embodiments, the evaluating in 130 may include estimating at least one of an oil water ratio and a solid content of the drilling fluid. An oil water ratio (OWR) may be computed, for example, as described in more detail below. The solid content of the drilling fluid may be estimated from an amplitude of a T2 relaxation time obtained from the T1T2 plots (as also described in more detail below).

As described above with respect to FIG. 1 the NMR measurements may be made in 126 at ambient conditions or at elevated temperature and/or pressure conditions. Moreover, the samples and modified samples may optionally be aged at ambient conditions or in a high temperature chamber. In embodiments in which the NMR measurements are made at high temperature (or the samples are aged at high temperature), the NMR measurement system may be fully or partially deployed in the chamber such that components of the NMR system (e.g., the DC magnetic and/or the radio frequency antenna) are at substantially the same temperature as the sample(s).

As also described above with respect to FIG. 1, it may be advantageous to make use of samples including a water based brine and other samples including a $D_2O$ based brine to further enable the contributions of oil based components and water based components in the drilling fluid to be separated (initially and/or as the sample ages).

Figure 3:
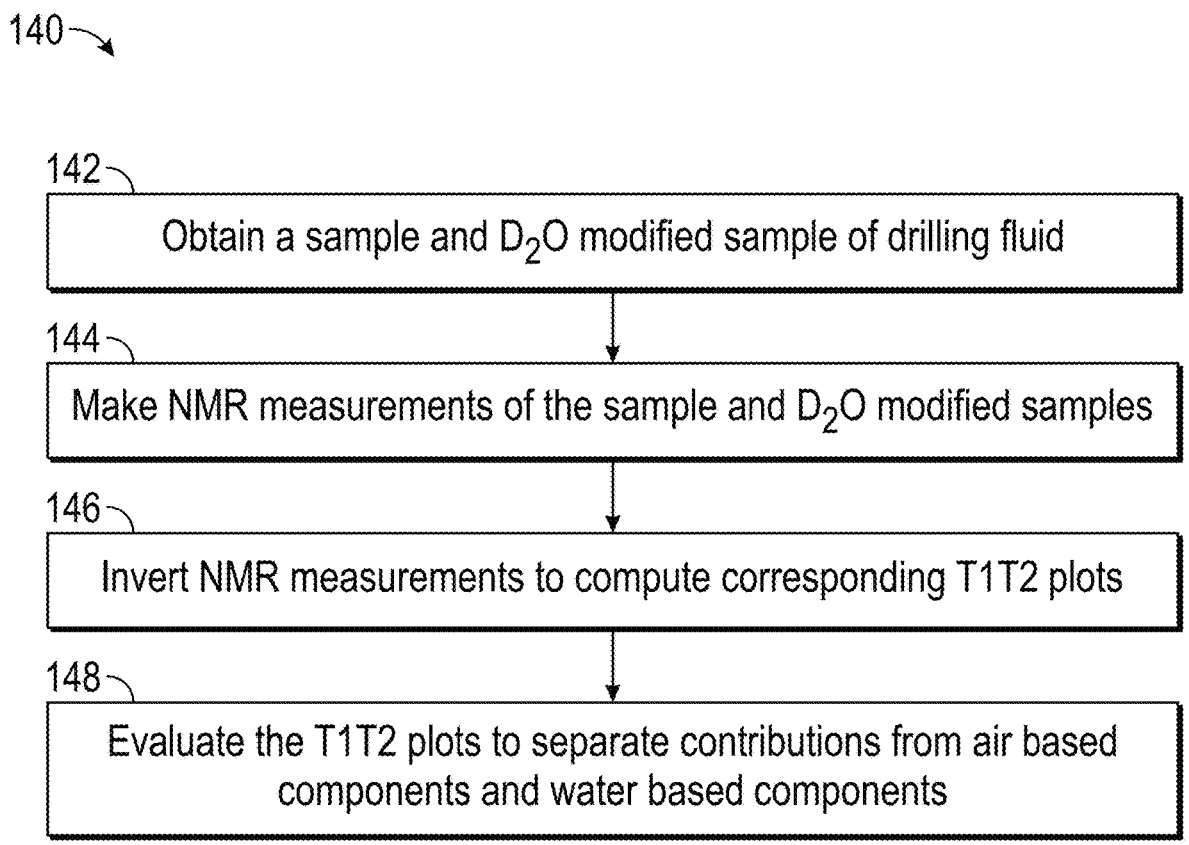
FIG. 3 depicts a flow chart of yet another disclosed method embodiment.

FIG. 3 depicts a flow chart of yet another disclosed method embodiment 100 for evaluating drilling fluid. The method 140 includes obtaining a sample and a modified sample of the drilling fluid at 142. The sample of drilling fluid includes a water based brine and the modified sample includes a deuterium oxide based brine replacing the water based brine. The sample and the modified sample may further include, for example, an oil based component and barite. In general, the sample and modified sample include the same type and amount of the oil based component and the barite.

An NMR measurement system makes corresponding NMR measurements of the sample and the modified sample at 144. These NMR measurements are inverted at 146 to obtain corresponding T1T2 plots. The T1T2 plots are then evaluated at 148 (e.g., by comparing the peaks in the plots) to separate contributions from oil based components and water based components of the sample of drilling fluid. As described in more detail below the T1T2 plots for the modified sample do not include peaks corresponding to the water based brine (since the modified sample includes a deuterium based brine). The peaks corresponding to the oil based components and/or the solid (e.g., barite) components may therefore be readily identified in the T1T2 plots.

In certain embodiments it may be advantageous to age the sample and the modified sample (e.g., at ambient conditions or at high temperature and/or high pressure conditions). In such embodiments, the NMR system makes corresponding NMR measurements of the fresh and aged sample and modified sample. The evaluation in 148 may then further include comparing peaks in the T1T2 plots obtained from the sample, the aged sample, the modified sample, and the aged modified sample to identify phase separation in the sample and in the aged sample.

In the examples that follow a number of drilling fluid samples were evaluated using NMR measurements (e.g., as described above using methods 100, 120, and/or 140). All of the disclosed NMR measurements were made using a 2 MHz Magritek Rock Core Analyzer at 20 degrees C. and 1 atmosphere pressure. As described above, the disclosed embodiments are not limited to such ambient measurements, but alternatively and/or additionally be made at high temperature and/or high pressure conditions.

The disclosed embodiments and the following examples envision at least two application (operation) scenarios: (i) developing improved drilling fluids and (ii) life cycle monitoring and optimization of drilling fluid at a rig site and may provide information related to free oil seep, drilling fluid stability, solid content and density tracking, oil water ratio, quality control, additive monitoring, and distribution of droplet size.

Figure 4A:
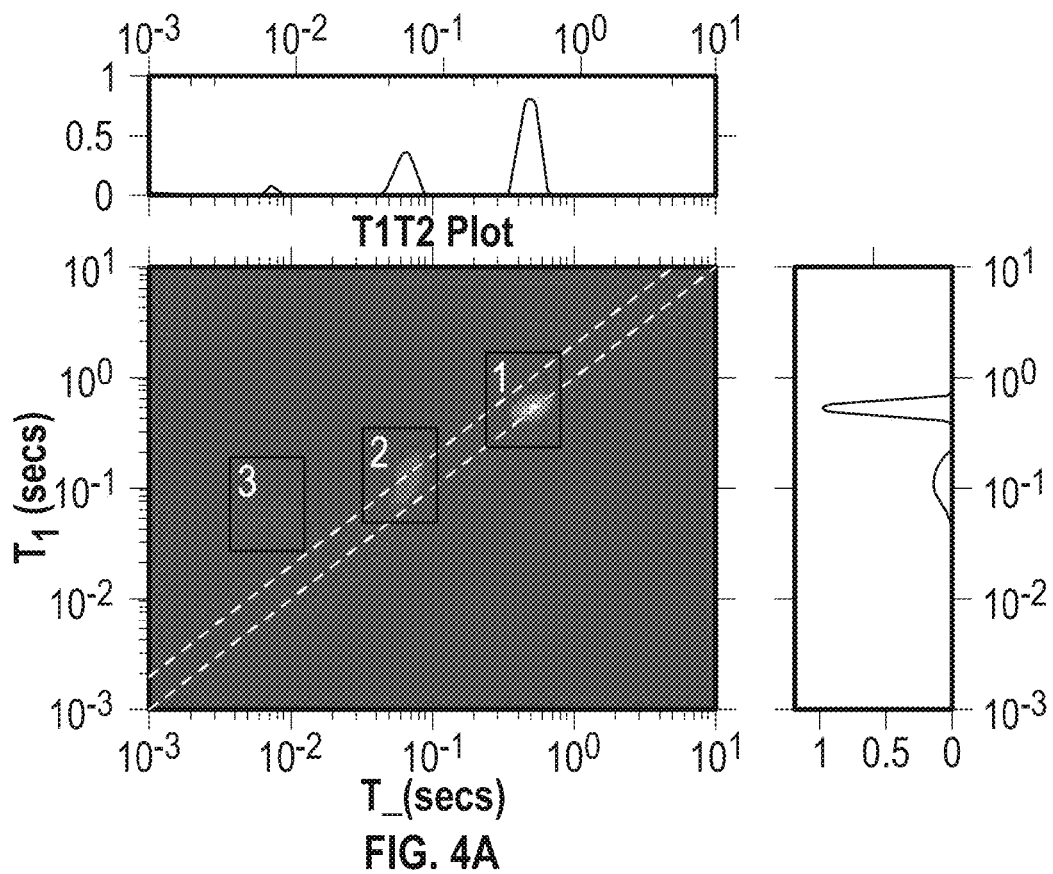
FIGS. 4A and 4B depict T1T2 plots for first and second drilling fluid samples in which the first drilling fluid does not include barite (4A) and the second drilling fluid includes micronized barite (4B).
Figure 4B:
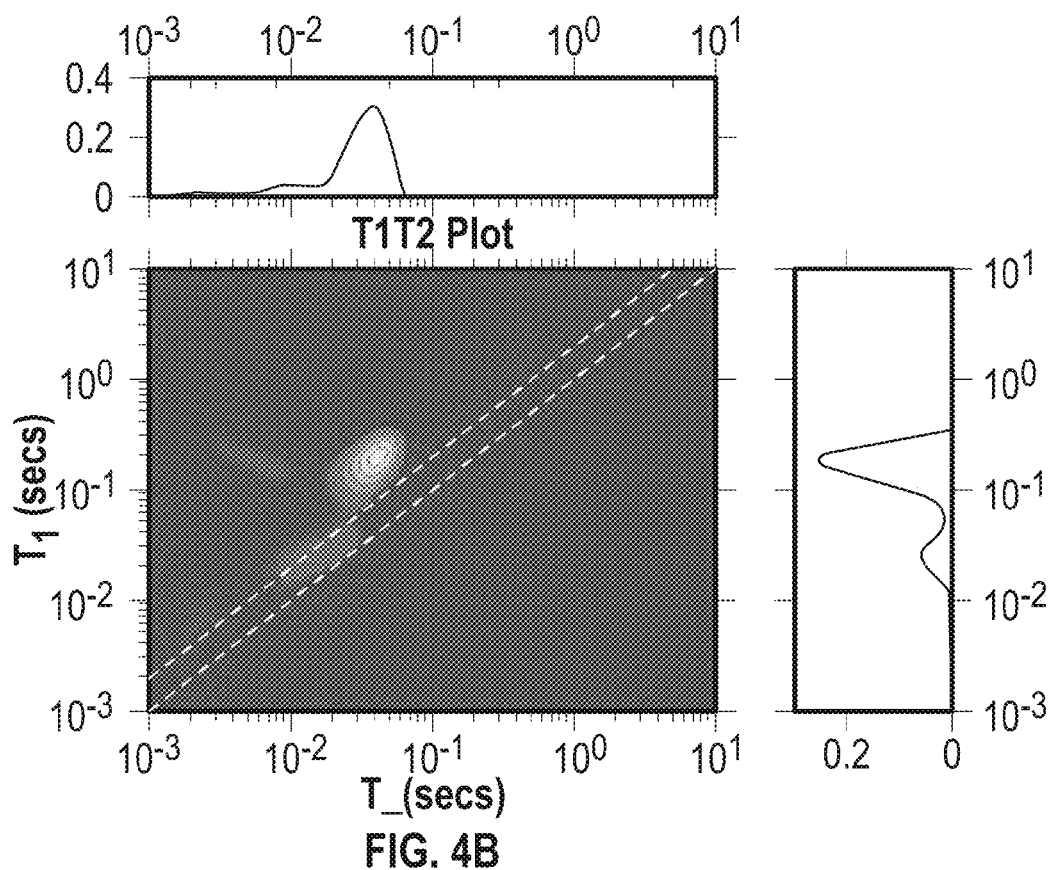

FIGS. 4A and 4B depict T1T2 plots for first and second drilling fluid samples. In the first sample (4A) (which does not include barite), the base oil, water based brine, and clay bound fluids are well separated with peak (1) being indicative of the oil, peak (2) being indicative of the brine, and peak (3) being indicative of the clay bound fluid. In the second sample (including micronized barite) (4B), the base oil, water based brine, and clay bound fluids peaks are not nearly so well separated, illustrating the difficulty of evaluating certain NMR measurements on certain drilling fluids. The shortened T1 and T2 relaxation times of nearly two numerical decades are possibly attributed to the magnetic gradient incurred by ferromagnetic impurities in barite particles. Moreover, the T1T2 peaks are observed to be broadened and are more scattered in the plot.

Figure 5A:
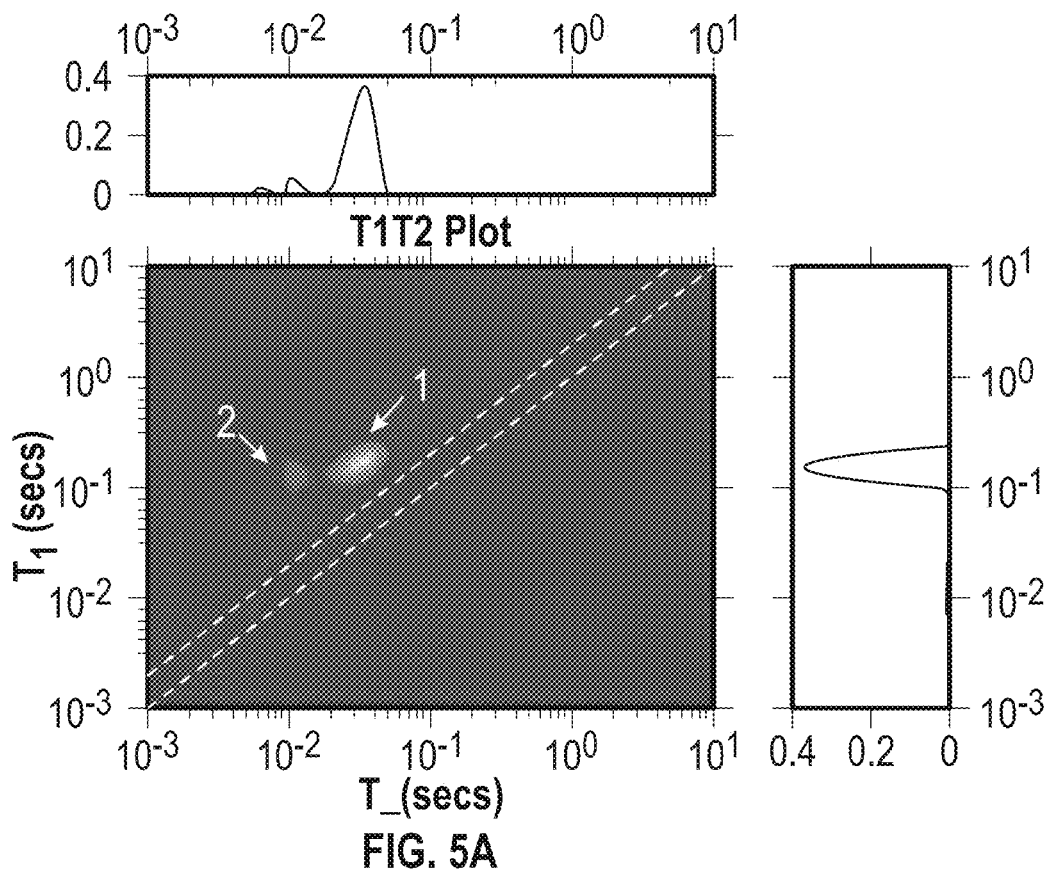
FIGS. 5A-5F depict T1T2 plots for first and second drilling fluids. The first and second drilling fluids were identical with the exception that the first drilling fluid (5B and 5E) included 25 percent $CaCl_2$) water based brine and the second drilling fluid (5A and 5D) included 25 percent $CaCl_2$) deuterium oxide based brine.
Figure 5B:
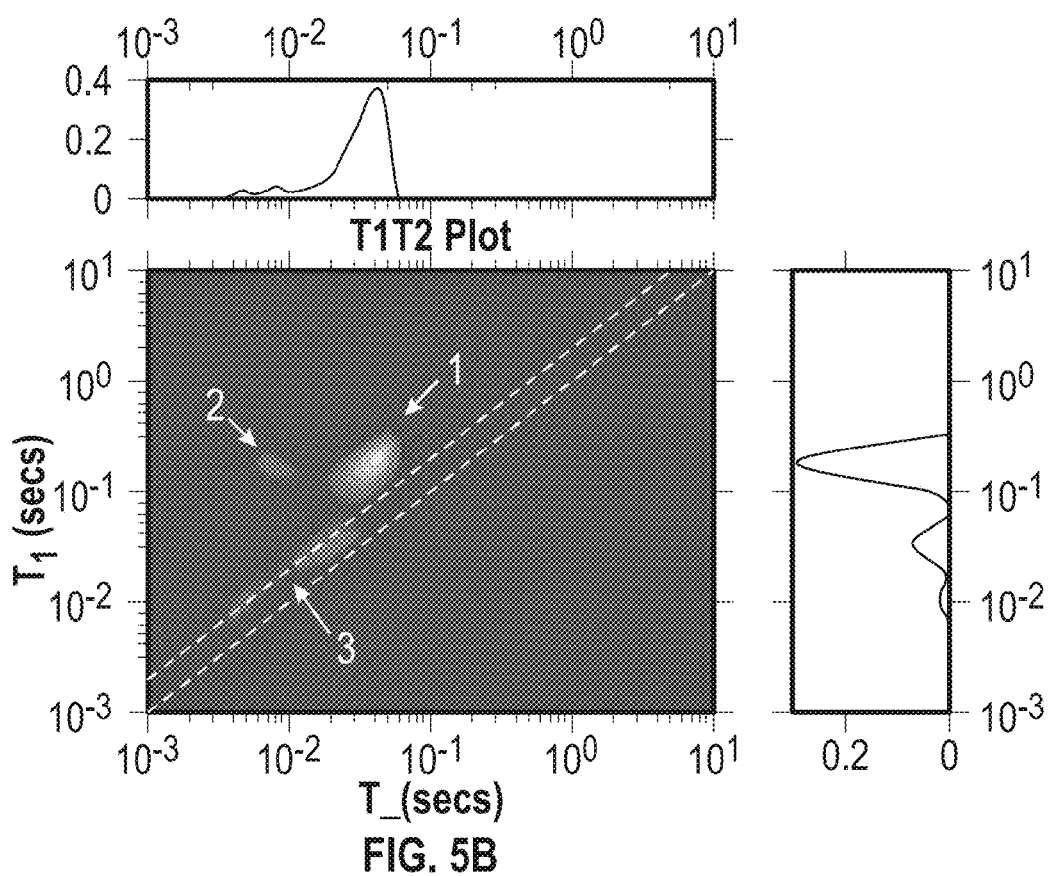
Figure 5C:
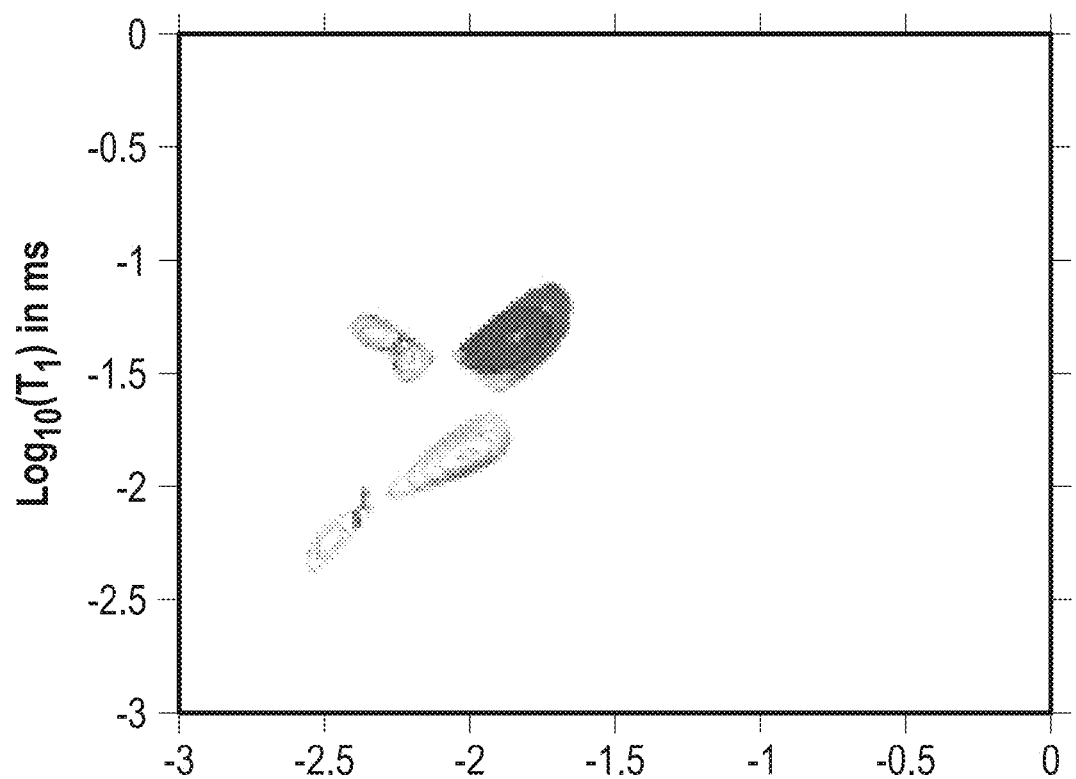
Figure 5D:
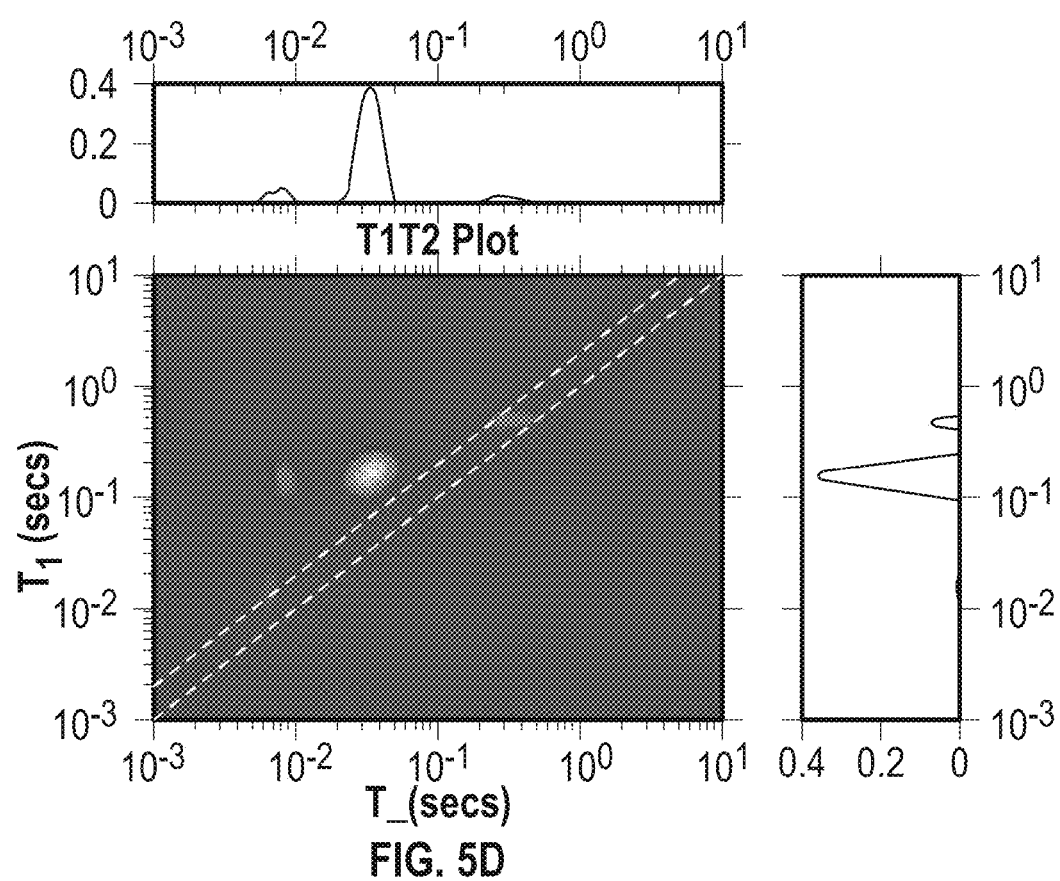
Figure 5E:
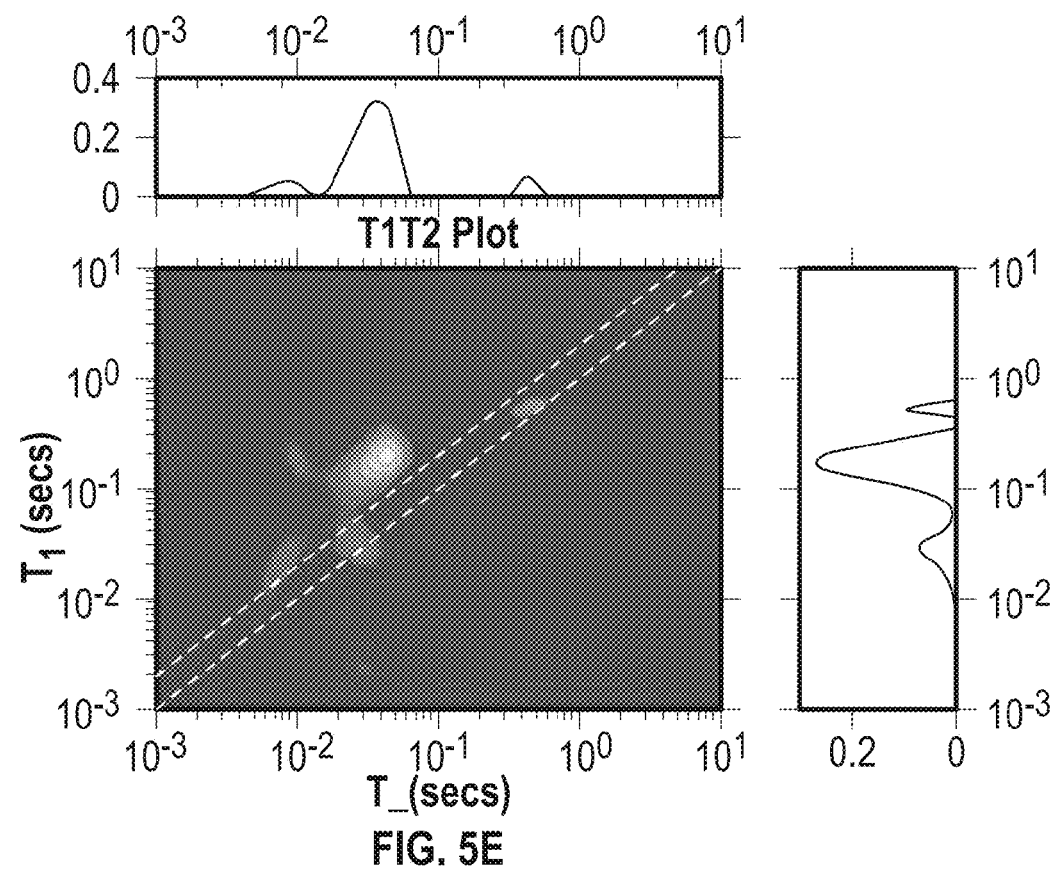
Figure 5F:
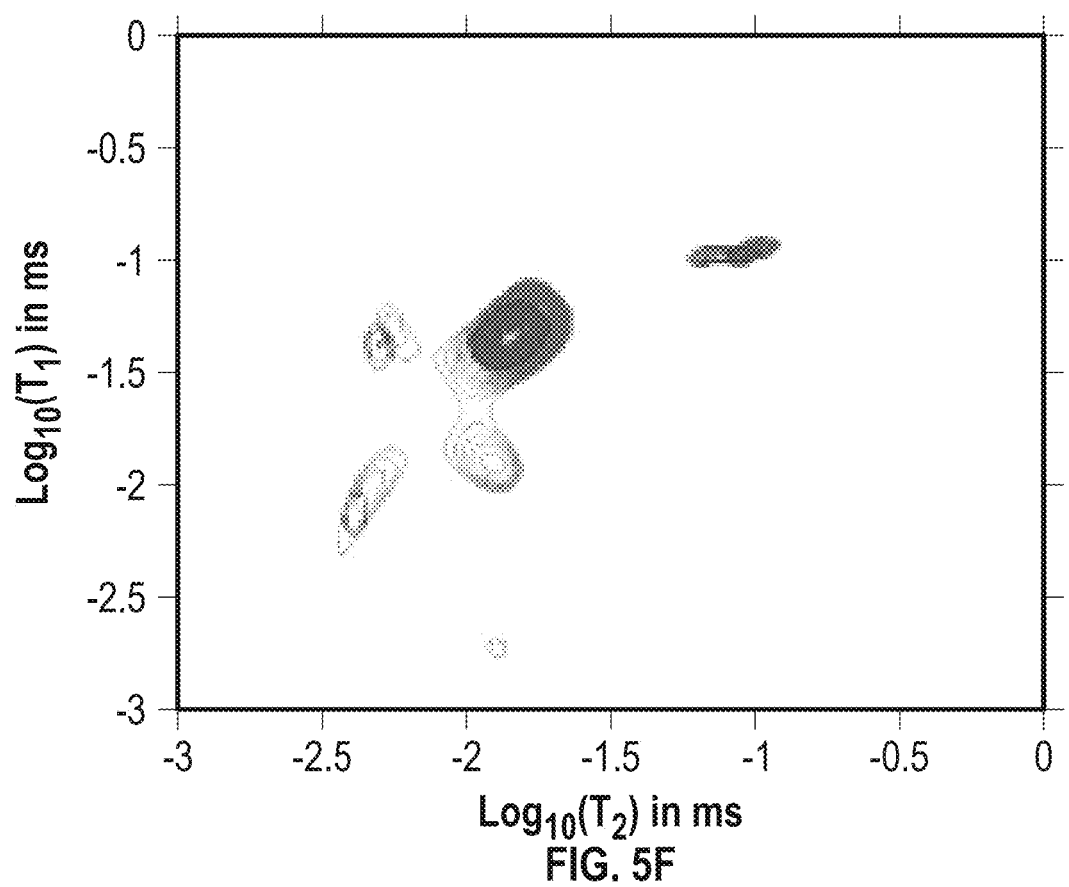

FIGS. 5A-5F depict T1T2 plots for first and second drilling fluids. The first and second drilling fluids were identical with the exception that the first drilling fluid (depicted on FIGS. 5B and 5E) included 25 percent $CaCl_2$ water based brine and the second drilling fluid (depicted on FIGS. 5A and 5D) included 25 percent $CaCl_2$ $D_2O$ based brine (>99.95% purity, Sigma Aldrich). The T1T2 plots shown on FIGS. 3A and 3B were obtained from fresh samples (after agitation at 20k rpm) and the T1T2 plots shown on FIGS. 5D and 5E were obtained after two days of sagging (aging) at ambient, static (no mixing) conditions. FIGS. 5C and 5F depict peak contours that show a side by side comparison of the two samples (fresh in 5C and aged in 5F).

With further reference to FIGS. 5A and 5B, note that peaks 1 and 2 appear in both the $D_2O$ (5A) and $H_2O$ (5B) samples. These peaks may therefore correspond to the oil based components in the drilling fluid samples. Peak 2 has a lower volume fraction (about 5%) and therefore likely originates from oily additives such as the emulsifier and/or wetting agent. Peak 1 has a much higher volume fraction and likely originates from the base oil. Peak 3 only appears in the water based brine sample (5B) and therefore corresponds to the brine since the $D_2O$ brine is invisible on the T1T2 plots ($D_2O$ and $H_2O$ are chemically equivalent, however deuterium is NMR silent).

With reference to the aged samples shown on FIGS. 5D and 5E, note that the T1T2 plots are largely consistent (similar) with the fresh samples with the notable exception of a long relaxation component at T2=0.5 s, likely corresponding to accumulated free oil. The T1T2 plots are consistent with a visual observation of the samples. A layer of translucent fluid was observed at the top of both fluid samples indicating that the gel system had partially collapsed, and as a result some base oil was discharged and coalesced.

One use of NMR is to measure an oil water ratio (OWR) of fluid samples. To validate this application a wide range of OWR were prepared by diluting a drilling fluid sample. In this example, OWR is defined as the volumetric ratio of oil and water. For example, an OWR=100:40 represents a sample that contains 100 mL oil and 40 mL water, where oil is defined as all the oily compounds (including base oil, emulsifier, and the wetting agent) and water is defined as the $CaCl_2$) doped brine.

Since the water in these samples included a substantial amount of salt (e.g., 25 percent brine solutions), the proton density of the base oil and water were calibrated using NMR measurements employing a Carr-Purcell-Meiboom-Gill (CPMG) pulse train. The proton density ratio of oil over water was found to be 1.1. This coefficient was subsequently used to convert the NMR spectral ratio to volumetric ratio of the two fluid species. It will be understand to those of ordinary skill in the art that the proton density ratio of oil over water may have a value that differs from 1.1 when a different type or amount of salt is used in the brine.

Figure 6A:
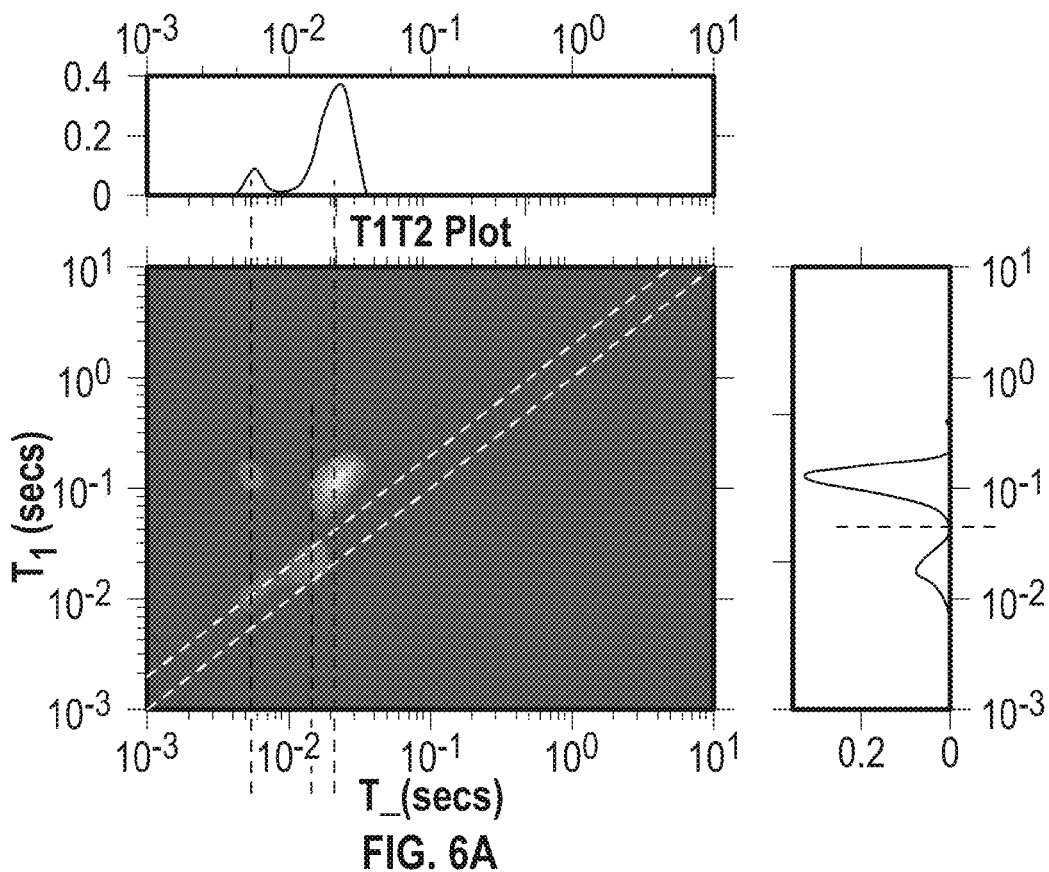
FIGS. 6A-6C depict T1T2 plots for three samples, wherein the second and third samples were obtained by diluting the first sample with base oil at 17 parts by volume original drilling fluid to 3 parts by volume base oil (second sample) and 1 part by volume original drilling fluid to 1 part by volume base oil (third sample).
Figure 6B:
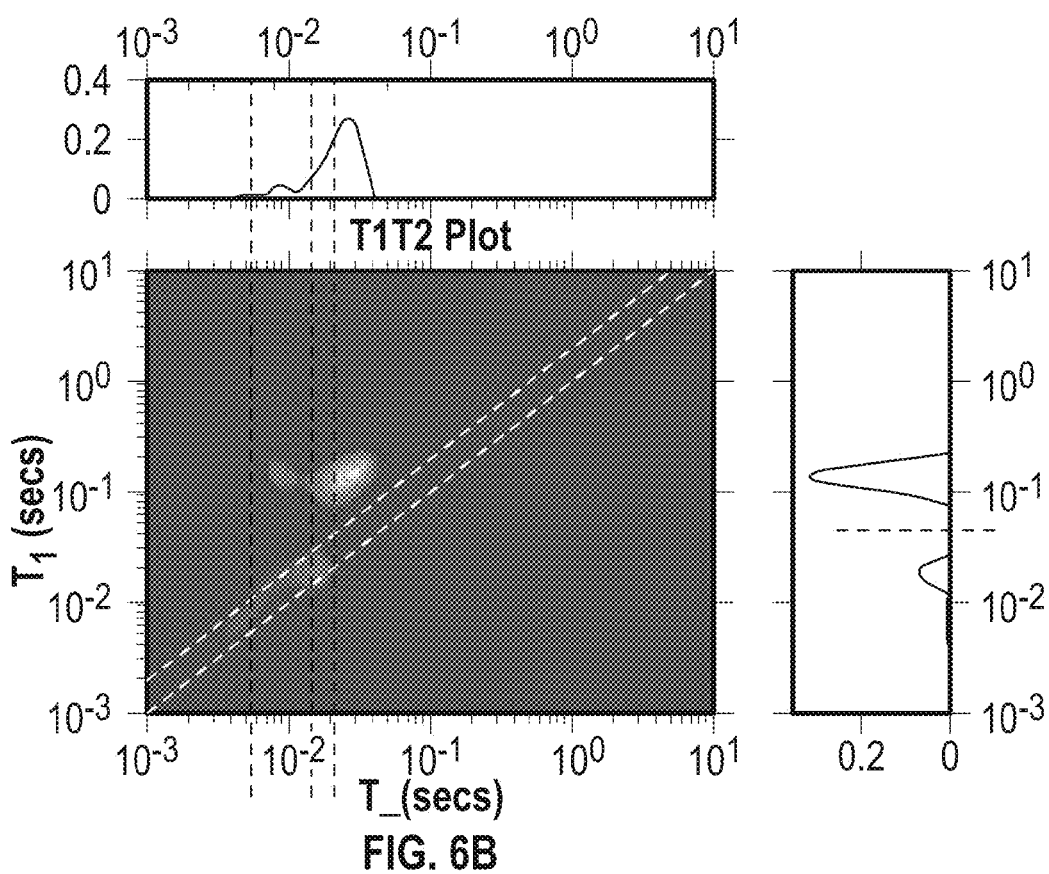
Figure 6C:
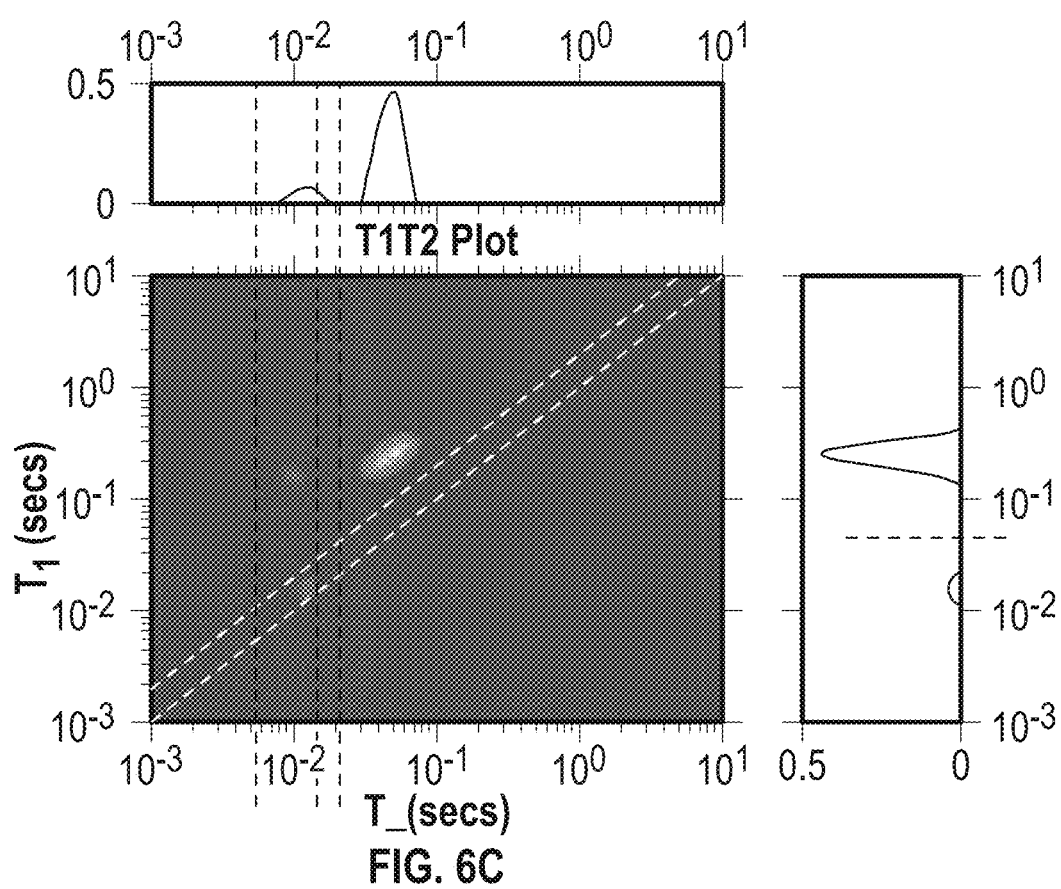

FIGS. 6A-6C depict T1T2 plots for three samples. The first sample included un-diluted drilling fluid identical to the drilling fluid used in FIGS. 5B and 5E (the fluid including the water based brine). The second and third samples were obtained by diluting the original un-diluted drilling fluid with the base oil. The second sample included 17 parts by volume original drilling fluid to 3 parts by volume base oil. The third sample included 1 part by volume original drilling fluid to 1 part by volume base oil. The computed OWRs (theoretical OWRs based on the formulation) were 100:32.4 (sample 1), 100:24.5 (sample 2), and 100:11.5 (sample 3) as given in Table 1.

OWR_NMR values can be calculated based on the T1T2 plots in FIGS. 6A-6C. In this example, the numerical ratio of the two peaks on the projected T1 dimension were calculated and further converted to OWR_NMR by applying the proton density ratio of 1.1. The OWR_NMR values were in very good agreement with theoretical values given above: 100:31.8 (sample 1), 100:25.4 (sample 2), and 100:9.5 (sample 3) as also shown in Table 1.

TABLE 1

| Drilling Fluid Sample | OWR_theoretical | OWR_NMR |
| --- | --- | --- |
| Original | 100:32.4 | 100:31.8 |
| 17:3 Dilution | 100:24.5 | 100:25.4 |
| 1:1 Dilution | 100:11.5 | 100:9.5 |

Further, note that the base oil peak in the T1T2 plots moves towards longer relaxation times in the diluted samples. Specifically, the peak maximum exhibits a slightly decreasing T1/T2 ratio from 5.6 to 5.3 when comparing the original drilling fluid (6A) to the 1:1 diluted sample (6C). Moreover, T2 of the maximum is a bit more than doubled from 23 to 49 milliseconds, indicating dilution of the barite concentration by half.

Also note that the brine peak remains largely unchanged while its tail into short relaxation times seems diminished and eventually disappeared in the diluted samples. As dilution is done by handshaking (rather than blending at high RPM), it is believed that the water-droplet configuration remained undisturbed. This remains largely the case.

The disclosed NMR methods may further be used to characterize aging of drilling fluid over a predetermined time interval and/or at predetermined intervals over time interval. When an emulsion such as a drilling fluid breaks down, the oil phase commonly coalesces into a continuous bulk state. Owing to the changing chemical environment, the "free oil" (the bulk state oil) embodies a distinctive NMR signature from the emulsified fluid. One way to quantify this sagging process (the aging process during which the emulsion breaks down) is to track free oil fraction over time in a drilling fluid sample. Free oil may be defined, for example, as the portion of base oil that is different (from fluid fabric point of view) from its fully emulsified counterpart. It is not necessarily the distinctive layer of translucent oil in a well-aged sample.

Figure 7A:
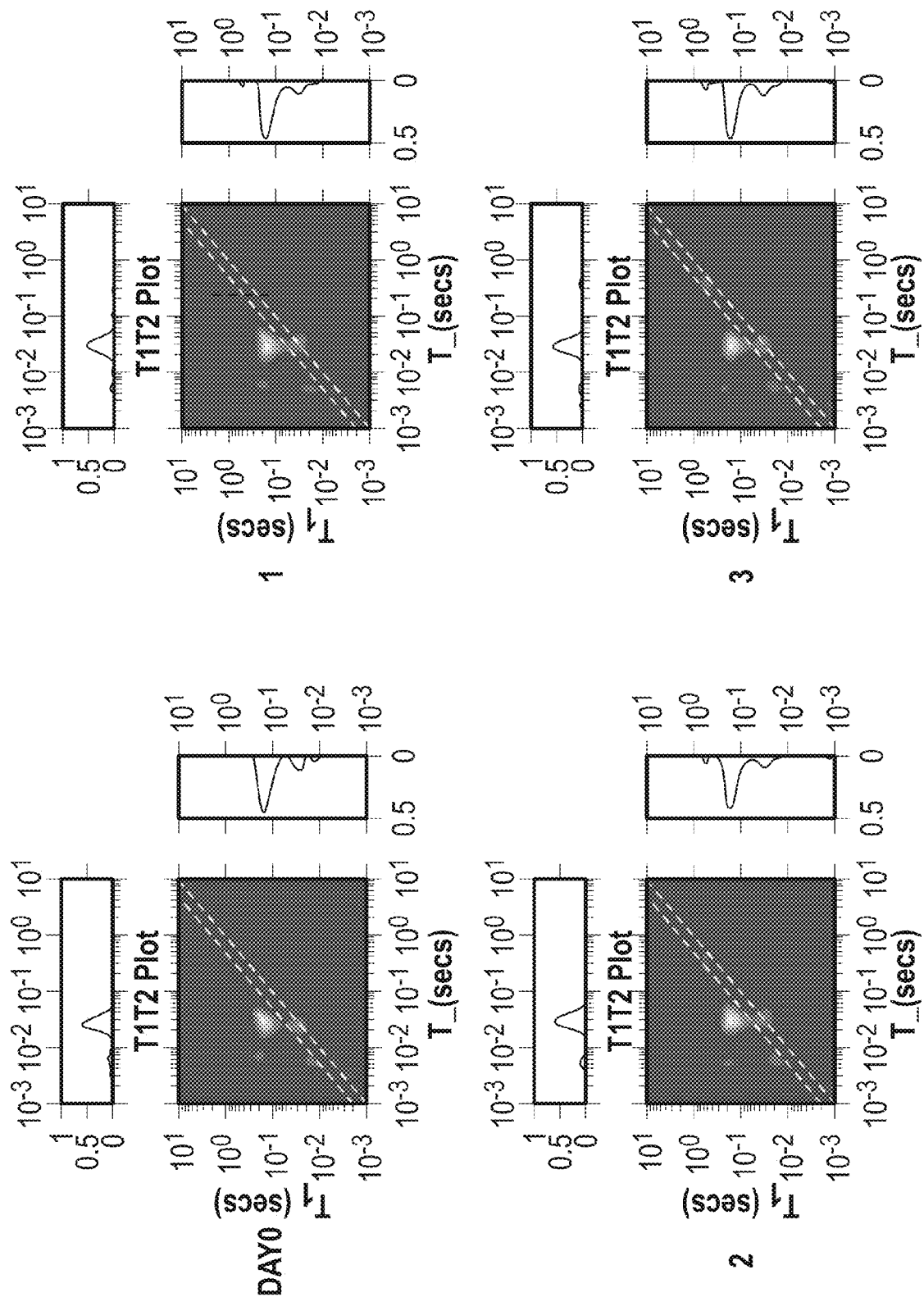
FIG. 7A depicts T1T2 plots of a drilling fluid aged under ambient, static conditions over a period of 8 days (T1T2 plots for days 0 through 7 are depicted).
Figure 7A:
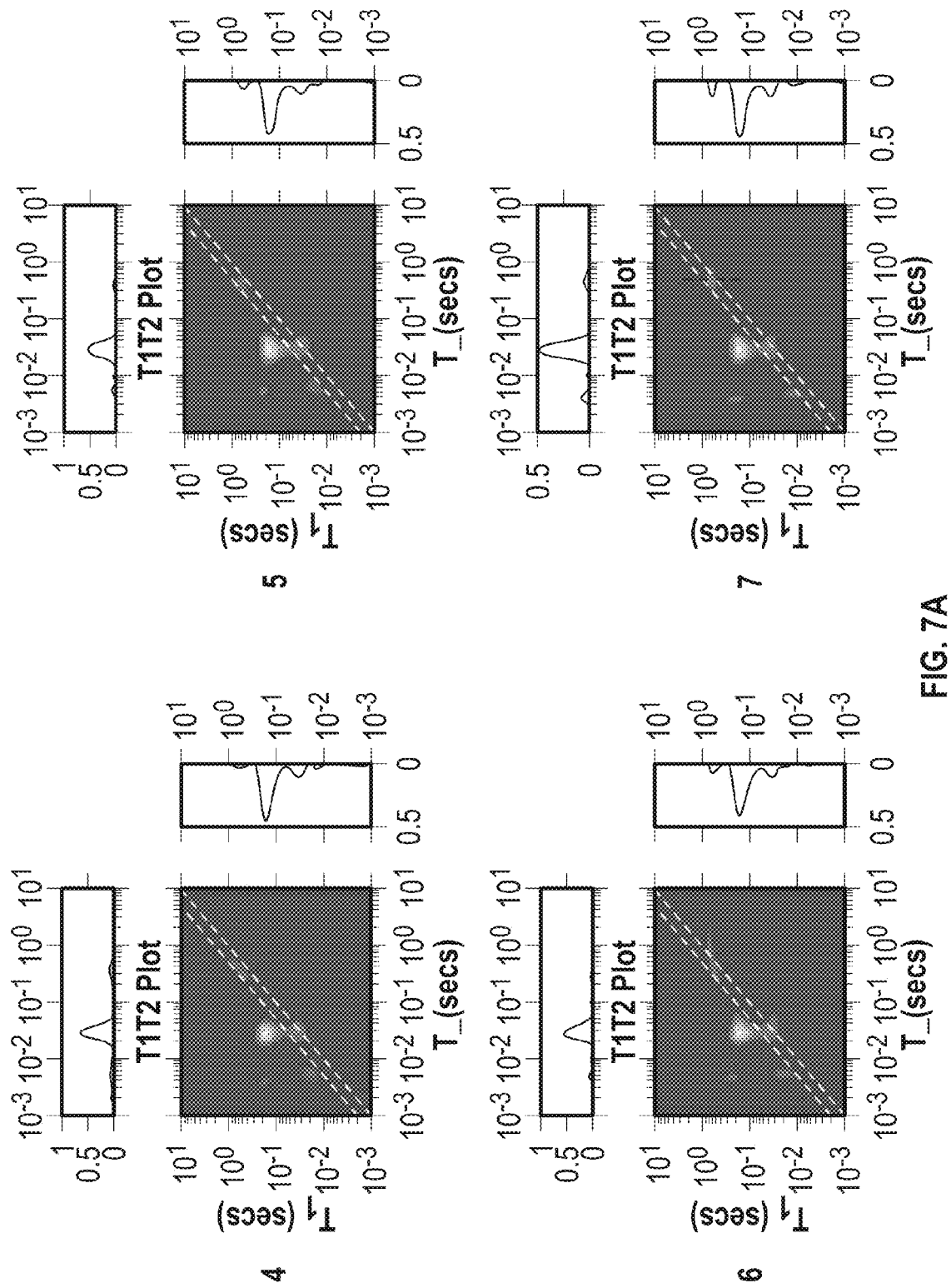
Figure 7B:
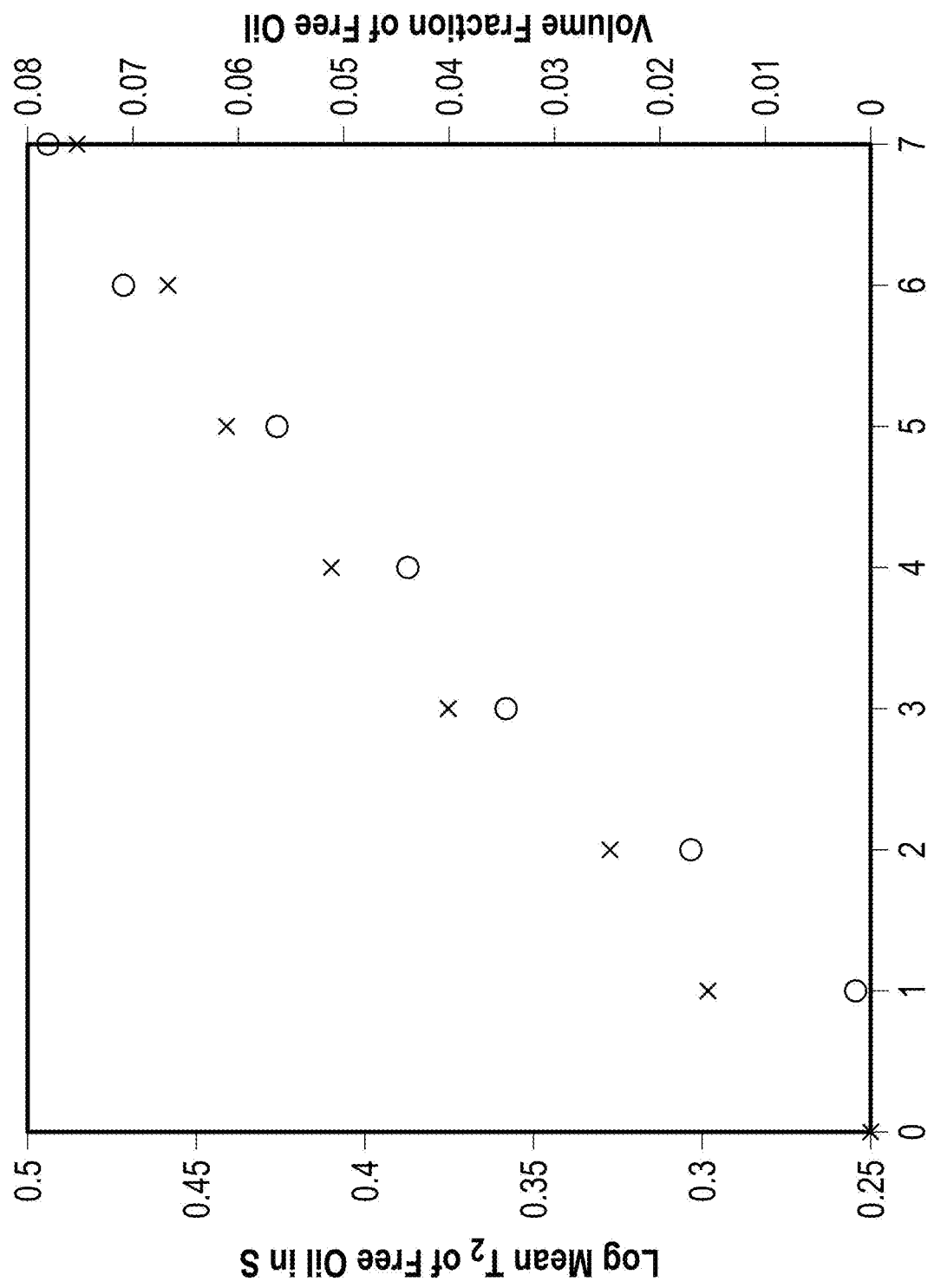
FIG. 7B plots the log mean T2 of the free oil (left vertical axis) and volume fraction of the free oil (right vertical axis) versus time in days on the horizontal axis from the T1T2 plots depicted in FIG. 7A.

FIG. 7A depicts daily T1T2 plots of a drilling fluid aged under ambient, static conditions over a period of 8 days (days 0 through 7). The dashed line in days 1 and 7 highlights the free-oil component that increases both in amplitude and in T2. FIG. 7B plots the log mean T2 of the free oil (left vertical axis) and volume fraction of the free oil (right vertical axis) versus time on the horizontal axis.

With reference again to FIG. 7A, a small fluid signature appears on day 1, with T1/T2~2. This signature corresponds to just-emancipated oils that were still under severe motion restrictions. The fluid signature grows, both in amplitude and in relaxation times, in the following days. By day 7, the free oil makes up over 7% of total NMR signal and has T2 values of about 0.5 sec and T1 values of about 0.6 sec. FIG. 75B shows the development of volume friction and T2 as a function of time. In the early days when the free oil is still well dispersed in the bulk fluid, no other means but NMR can quantify their presence.

In addition to the emergence of the free oil and the distinctive features described above, the NMR spectra also reveal the temporal evolution of other fluid species. As described above with respect to FIG. 1, the full fluid dynamics can be captured by computing an NMR stability index that quantifies the change in T1T2 plots with time. The disclosed stability index is intended to cumulate the difference between T1T2 plots and to distinguish drilling fluids of the same chemical compositions but of different fluid configurations. As also noted above, increasing stability index is indicative of increasing tendencies of a drilling fluid to sag or separate with aging.

Figure 8A:
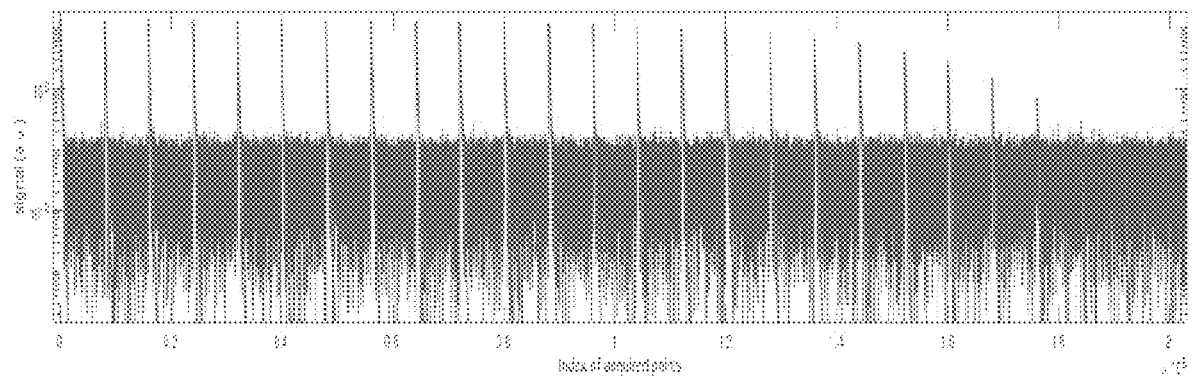
FIG. 8A depicts a plot of raw echo signal versus an index of the acquired points in which the blue indicates the raw data and the red indicates noise-free, time domain reconstructed data obtained by processing the T1T2 plot with a forward model.
Figure 8B:
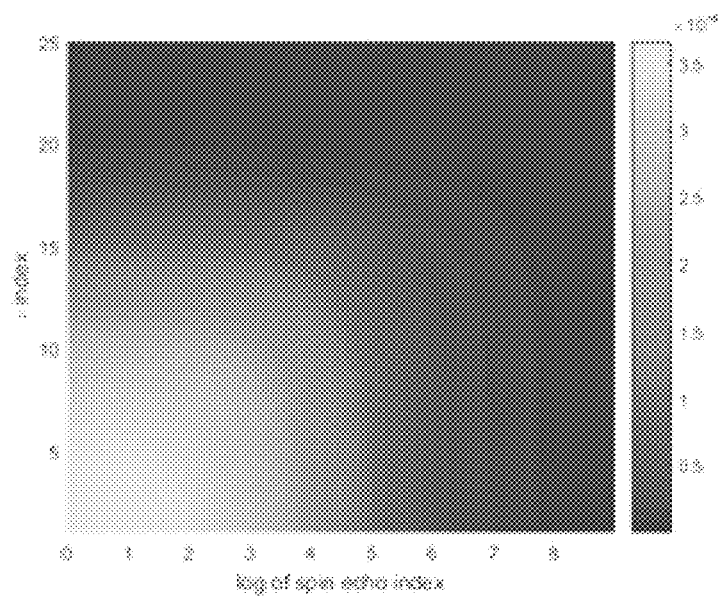
FIG. 8B depicts a normalized two-dimensional representation of the fitting results from FIG. 8A in which the horizontal axis is the log of echo index (from 1 to 8000) and the vertical axis is the index of T1 encoding.
Figure 8C:
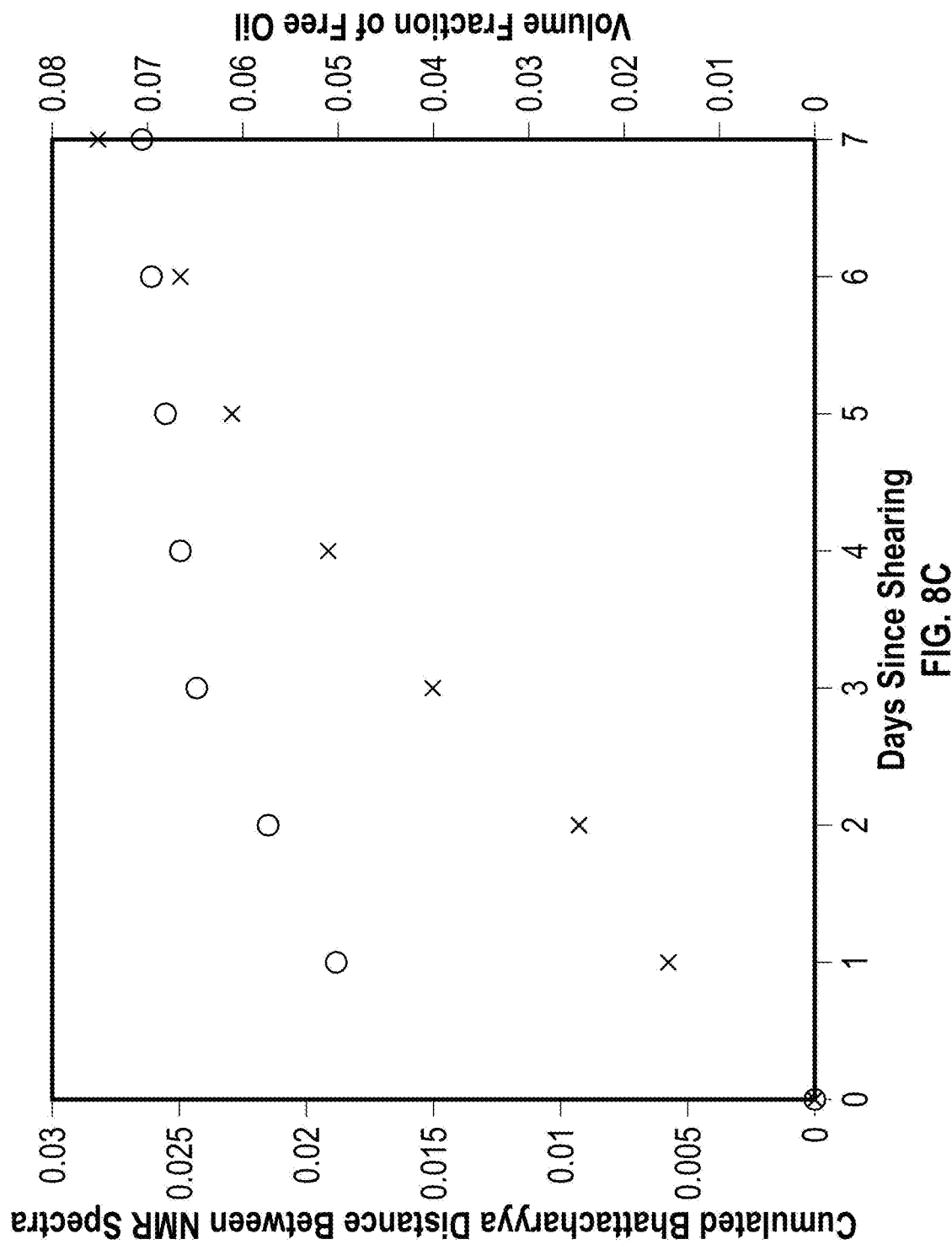
FIG. 8C depicts a plot of the stability index (the cumulated Bhattacharyya distance in this example) on the left axis and the volume fraction of free oil on the right axis versus aging time on the horizontal axis.

It will be understood that the stability index may be computed using either time-domain or T1T2 spectra (after Laplace inversion). FIGS. 8A-8C depict one example embodiment using time domain data obtained by applying a forward model to the T1T2 plot. The raw echo data (the NMR measurements) are depicted in blue in FIG. 8A (as a plot of signal versus an index of the acquired points). These measurements (the raw echo data) were inverted (e.g., using a Fast Laplace Inversion algorithm) to obtain a T1T2 plot (e.g., as described above with respect to FIGS. 1-3). The T1T2 plot was then processed with a forward model to obtain noise-free, time domain reconstructed data which is shown in red on FIG. 8A.

FIG. 8B depicts a normalized two-dimensional representation of the fitting results from FIG. 8A in which the horizontal axis is the log of echo index (from 1 to 8000) and the vertical axis is the index of T1 encoding. FIG. 8C depicts a plot of the stability index (the cumulated Bhattacharyya distance in this example) on the left axis and the volume fraction of free oil on the right axis versus aging time on the horizontal axis. The stability index was computed using the equation described above with respect to FIG. 1 using the time domain data depicted in red on FIG. 8A.

With continued reference to FIG. 8C, note that the free oil increases approximately linearly with time. The stability index increases fastest between days 0 and 1 and then continues to increase monotonically but at a diminishing rate. This observation indicates that the change of fluid fabric is most significant in early days, and slowly winds down over time. By quantifying the trajectory of the stability index ($SI_{NMR}$) for different fluid recipes, one may benchmark dynamics of fluid configuration in a quantitative manner as well as compare relative fluid stability.

It is evident from the results plotted in FIG. 8C that the stability index and free oil content reveal different aspects of fluid change with aging, and in many cases may provide complimentary information. In practice, it may be desirable to combine the two measures for interpreting the spatiotemporal variance of fluid dynamics. A data-driven approach may be applied to NMR fingerprints for discriminating drilling fluids of varying sag-resistance. For example, one may build a database of NMR measurements at ambient conditions and high temperature and/or high pressure conditions and then apply statistical methods (PCA, clustering, classification, etc.) to draw correlations between a drilling fluid's NMR fingerprints and its quality (such as $SI_{NMR}$ and other derived quantities). Once established, an NMR measurement may serve as an early indicator of mud quality in the development process.

NMR measurements may be further used to estimate the solid content (solid fraction) in a drilling fluid. For example, the solid fraction may be calculated by comparing the NMR signal of the sample and of component fluids of known composition. One example embodiment is described below in more detail with respect to FIGS. 9A and 9B and Tables 2A, 2B, and 2C for one example drilling fluid (the composition and characteristics of which are shown in Table 2A and 2B).

TABLE 2A

Drilling Fluid Composition

| Component | Mass (g) | Density (g/ml) | Volume (%) |
|---|---|---|---|
| Organo-clays | 0.50 | 1.3 | 0.1 |
| Base oil | 143.8 | 0.8 | 52.7 |
| Emulsifier | 6.1 | 1 | 1.8 |
| Wetting Agent 1 | 2 | 0.9 | 0.6 |
| Wetting agent 2 | 3 | 0.9 | 0.9 |
| LIME | 5 | 2.2 | 0.6 |
| 25% CaCl2 Brine | 78.9 | 1.2 | 18.3 |
| Fluid Loss Additive 1 | 0.5 | 1 | 0.1 |
| Fluid Loss Additive 2 | 0.75 | 0.9 | 0.2 |
| Suspension agent | 10 | 2 | 1.4 |
| Rheological Modifier | 0.5 | 1 | 0.2 |
| Micronized-Barite | 328.9 | 4.1 | 22.9 |
| Sum of products, g | 579.9 | | 100.0 |

TABLE 2B

Drilling Fluid Characteristics

| Theoretical Mw, ppg | 13.8 | | |
|---|---|---|---|
| Measured Mw, ppg (pycnometer) | 13.9 | | |
| Retort measurement | | From the composition | |
| Oil measured (%) | 55.5 | Oil (%) | 56.6 |
| Brine measured (%) | 17.5 | Brine (%) | 18.3 |
| Solid measured (%) | 27 | Solid (%) | 25.1 |
| Ratio Oil/Water | 3.2:1 | Ratio Oil/Brine | 3.1:1 |

As shown in Table 2B, the oil water (oil brine) ratio of the drilling fluid is 3.1:1 (computed based on the composition) and 3.2:1 (based on a retort measurement). The solid content (solid fraction) was computed (based on the composition) to be 25.1 percent.

Figures 9A, 9B:
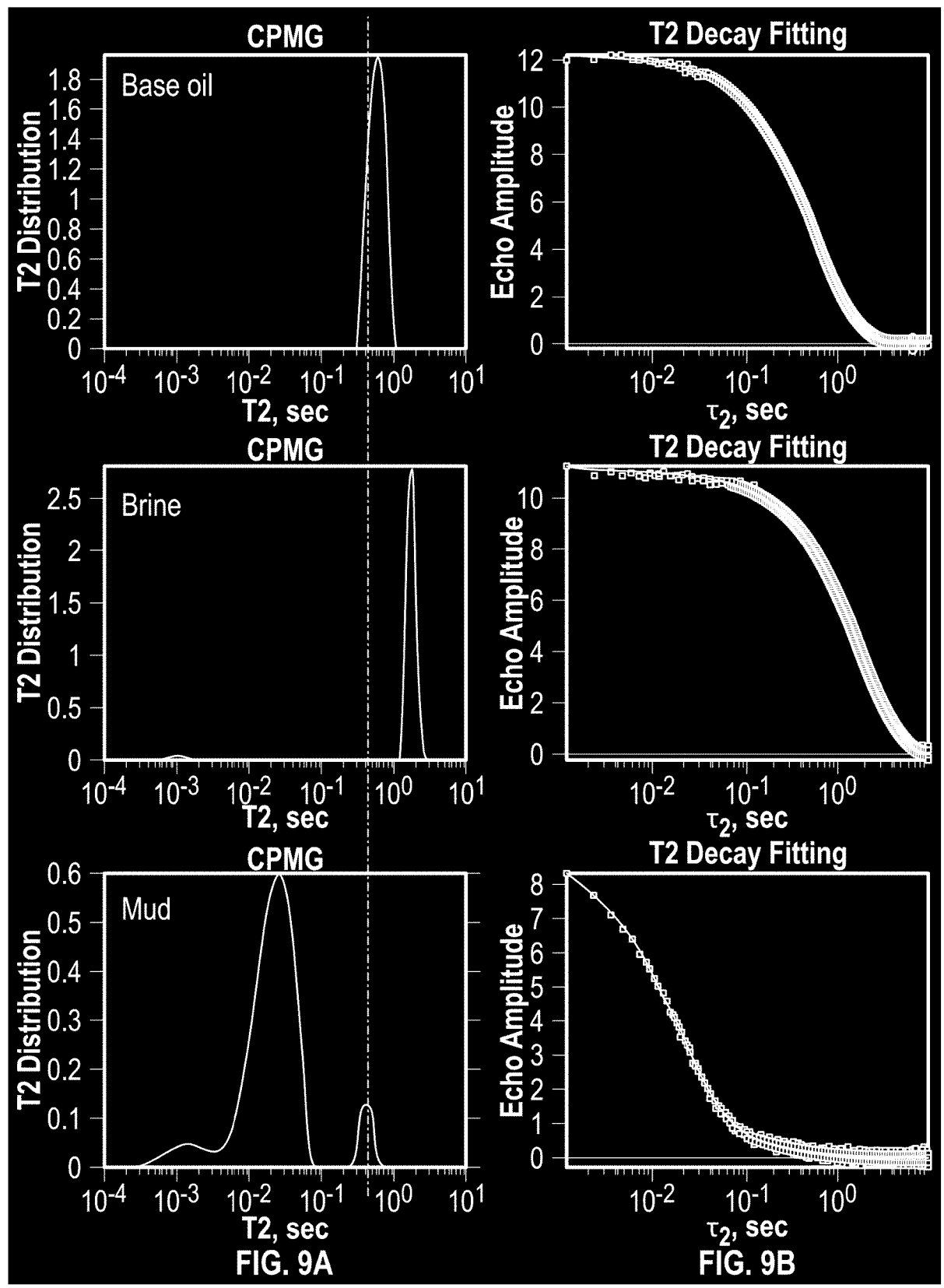
FIG. 9A depicts plots of T2 distribution versus T2 for use in a solid content calculation.
FIG. 9B depicts echo amplitude versus T2 for the base oil, the brine, and the full drilling fluid for the measurements made in FIG. 9A.

Referring now to FIGS. 9A and 9B, FIG. 9A depicts plots of T2 distribution versus T2 and FIG. 9B depicts echo amplitude versus T2 for the drilling fluid base oil, the drilling fluid brine, and the full drilling fluid of the drilling fluid sample. In this example (as shown in Table 3C), $S_{oil}$=11.91, $S_{mud}$=11.06 and $S_{mud}$=8.65 (where S represents the echo amplitude of the CPMG NMR measurements given the same volume of the fluids and where $S_{oil}$ represents the amplitude of the base oil, $S_{brine}$ represents the amplitude of the brine, and $S_{mud}$ represents the amplitude of the drilling fluid sample).

TABLE 2C

NMR Characteristics
CPMG Amplitude (t = 0)

| $S_{oil}$ | 11.91 |
|---|---|
| $S_{brine}$ | 11.06 |
| $S_{mud}$ | 8.65 |
| NMR_Solid, (%) | 26.1 |

The NMR amplitudes ($S_{brine}$, $S_{oil}$, and $S_{mud}$) shown in Table 2C may be processed to compute (or estimate) the solid content of the drilling fluid, for example as described below (where X represents the NMR based solid fraction):

$$(\text{oil\_fraction} \times S_{oil} + \text{brine\_fraction} \times S_{brine}) \times (1-X) = S_{mud}$$

In the example of FIGS. 9A and 9B, T2 relaxation measurements were performed on base oil, brine, and the drilling fluid of equal volume (samples of equal volume as noted above). Plugging the NMR measured S values into the equation above yielded an NMR solid fraction X for the drilling fluid of 26.1% (Table 2C) which was in good agreement with the value of 25.1% computed from the composition (Table 2B).

The drilling fluid density $\rho_{mud}$ may be further computed from X and OWR using the following mathematical equation:

$$(\text{oil\_fraction} \times \rho_{oil} + \text{brine\_fraction} \times \rho_{brine}) \times (1-X) + \rho_{barite} \times X = \rho_{mud}$$

where $\rho_{oil}$, $\rho_{brine}$, and $\rho_{barite}$ represent the densities of oil, brine, and the barite solids. In certain embodiments it may be useful to track density with aging of the drilling fluid. Plugging the oil, brine, and solids fractions obtained from the NMR measurements described above into the above equation (along with the known $\rho_{oil}$, $\rho_{brine}$, and $\rho_{barite}$) yields $\rho_{mud}$=13.5 ppg which is in good agreement with the pycnometer measurement shown in Table 2B.

Understanding the interaction of certain chemical additives with other fluid species can be important to drilling fluid development. In this regard, NMR may be used to quantitatively monitor dispersions of chemical additives in full mud samples, shedding light on the underlying physical/chemical processes.

Figure 10A:
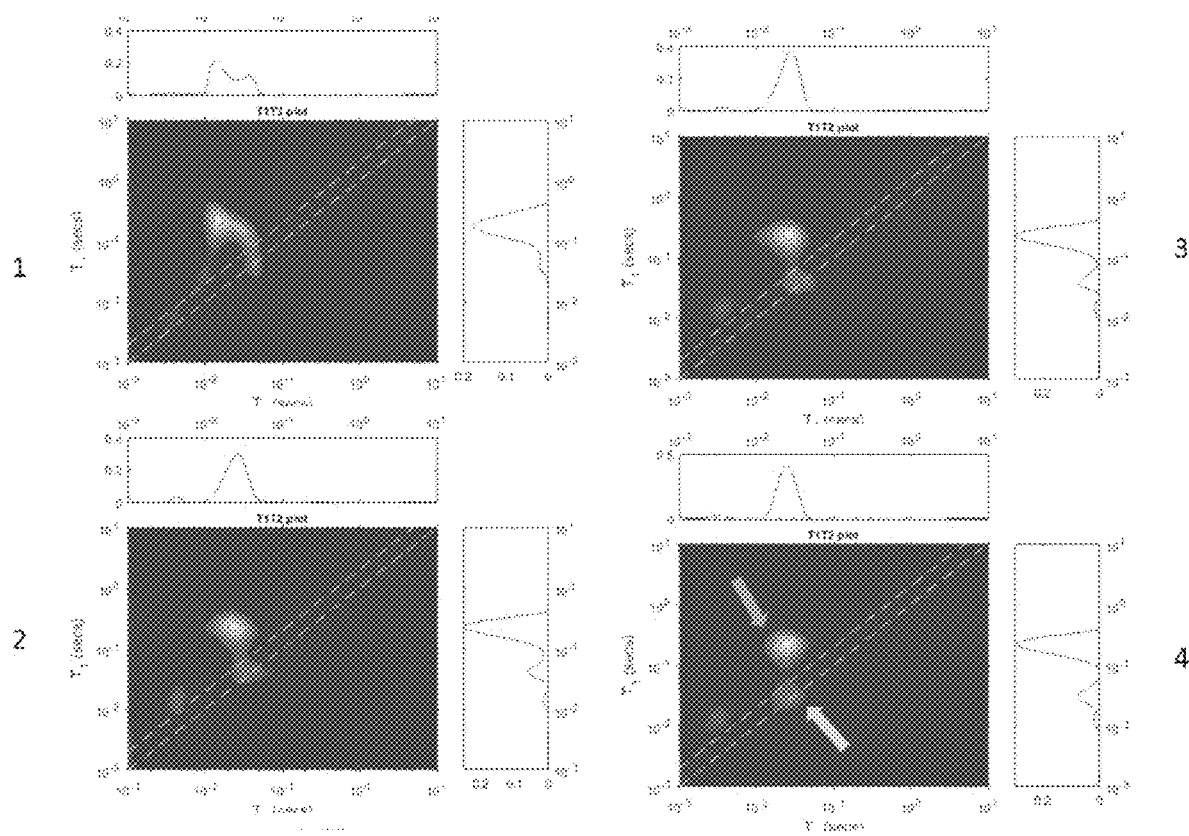
FIG. 10A depicts T1T2 plots for four drilling fluid samples in which the emulsifier content was increased stepwise by 0.5% volume fraction.
Figure 10B:
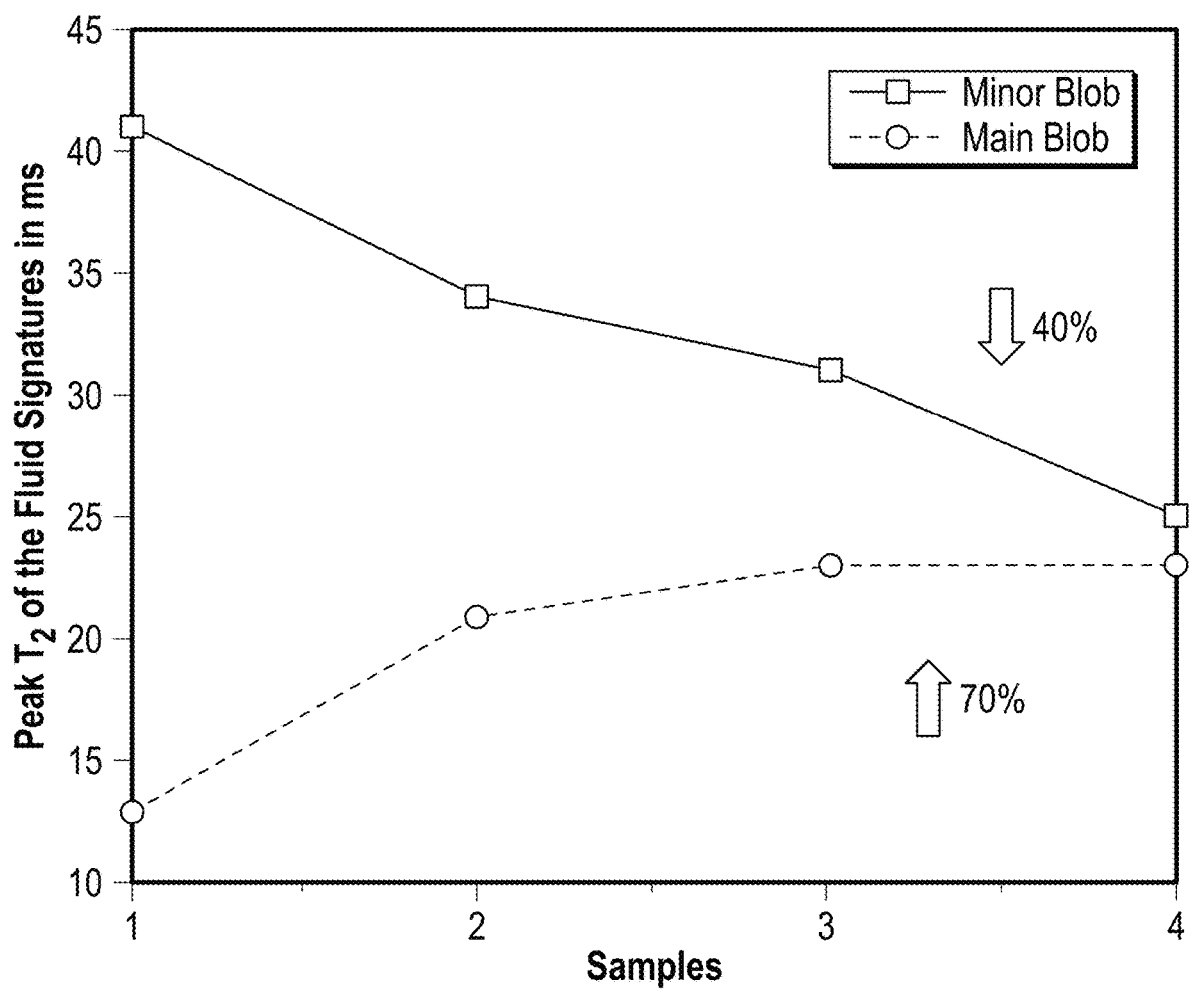
FIG. 10B depicts a plot of the peak T2 of the first and second (blue and orange) fluid signatures (peaks) versus the sample number (1, 2, 3, and 4).

FIG. 10A depicts T1T2 plots of four drilling fluid samples in which the emulsifier content was increased stepwise by 0.5% volume fraction (such that sample 2 had 0.5% volume fraction more emulsifier than sample 1, sample 3 had 0.5% volume fraction more emulsifier than sample 2, and so on). FIG. 10B depicts a plot of the maximum T2 in the peak of the first and second (blue and orange) fluid signatures (peaks) versus the sample number (1, 2, 3, and 4).

Note that the T2 relaxation time of the first peak (the minor peak indicated by the blue arrow) decreases with increasing emulsifier while the T2 relaxation time of the second peak (the major peak indicated by the orange arrow) increases with increasing emulsifier. These results indicate that the emulsifier modify the dynamics of brine and oil, but in largely opposite directions. One of ordinary skill in the art may envision using this observation (the amplitude of the oil and water peaks moving in opposite directions as shown on FIG. 10B) as an effective method for screening emulsifier additives in the development of new drilling fluids. Such screening may even be performed at high temperature and/or high pressure conditions to better evaluate emulsifying properties at operational conditions.

Figures 11A, 11B:
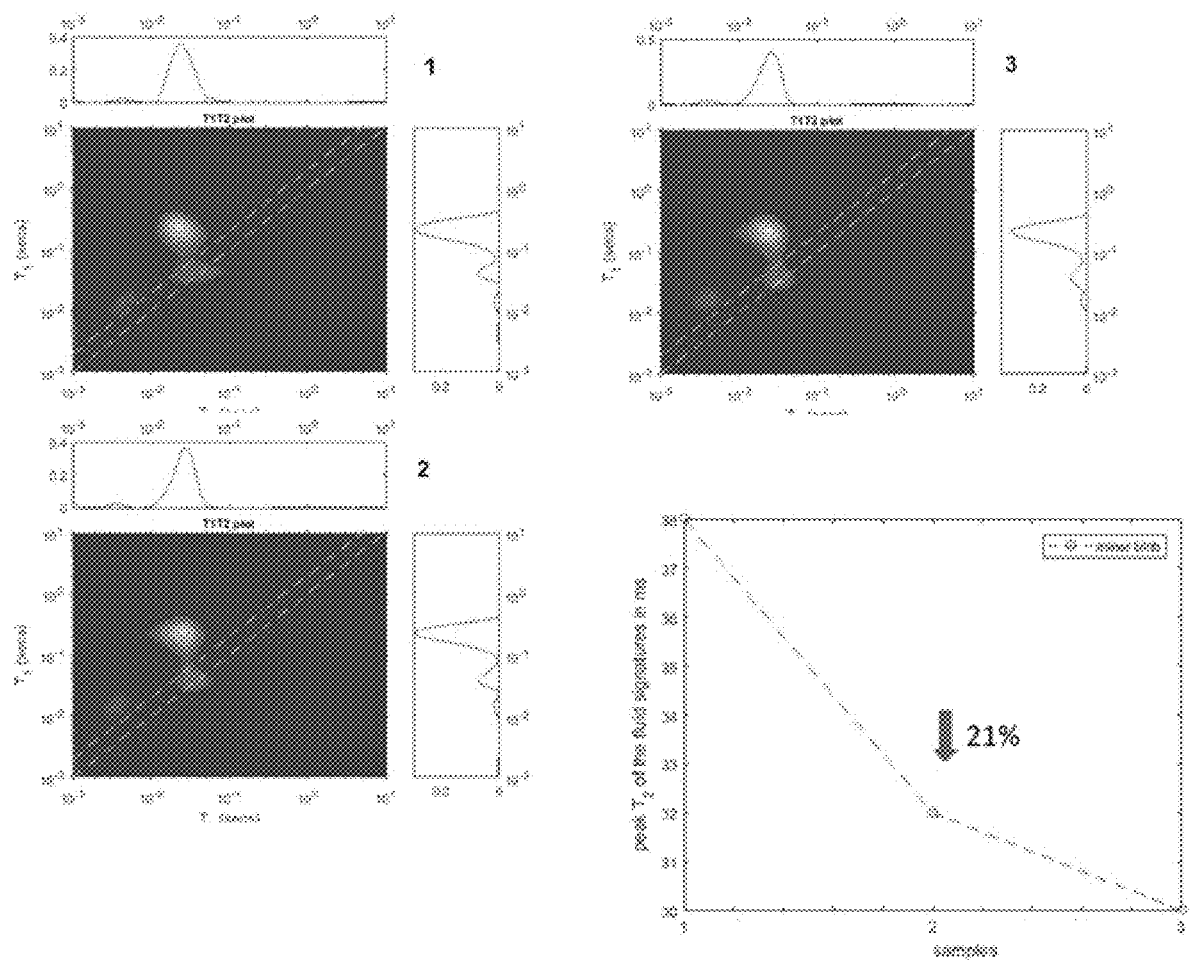
FIG. 11A depicts T1T2 plots for three drilling fluid samples in which an anti-sagging agent (sepiolite) was increased stepwise by 0.5% volume fraction.
FIG. 11B depicts a plot of the peak T2 of the minor peak in the T1T2 plots versus the sample number (1, 2, and 3).

FIGS. 11A and 11B depict an example in which an anti-sagging agent (sepiolite, a soft clay mineral) was increased stepwise by 0.5% volume fraction (such that sample 2 had 0.5% volume fraction more emulsifier than sample 1 and sample 3 had 0.5% volume fraction more emulsifier than sample 2). FIG. 11A depicts T1T2 plots for the three samples and FIG. 11B depicts a plot of the peak T2 of the minor peak in the T1T2 plots versus the sample number (1, 2, and 3). Note that the T2 relaxation time for the minor peak was substantially reduced but the main peak was essentially unchanged. This seems to suggest that the organoclays, though nominally oil-wet, were in close contact with brine molecules. One possibility is that those clays sit on the phase boundaries. One of ordinary skill in the art may envision using the observation of FIG. 11B as an effective method for screening anti-sagging agents. Such screening may even be performed at high temperature and/or high pressure conditions to better evaluate brine interaction at operational conditions.

During sample preparation, a high-speed shearing process may be required to fully agitate a drilling fluid including multiple constitutional components. In practice, it is often critical to ensure sufficient shearing for optimal drilling fluid performance. Accordingly, NMR may be utilized to assess qualities of drilling fluid sample preparation.

Figure 12:
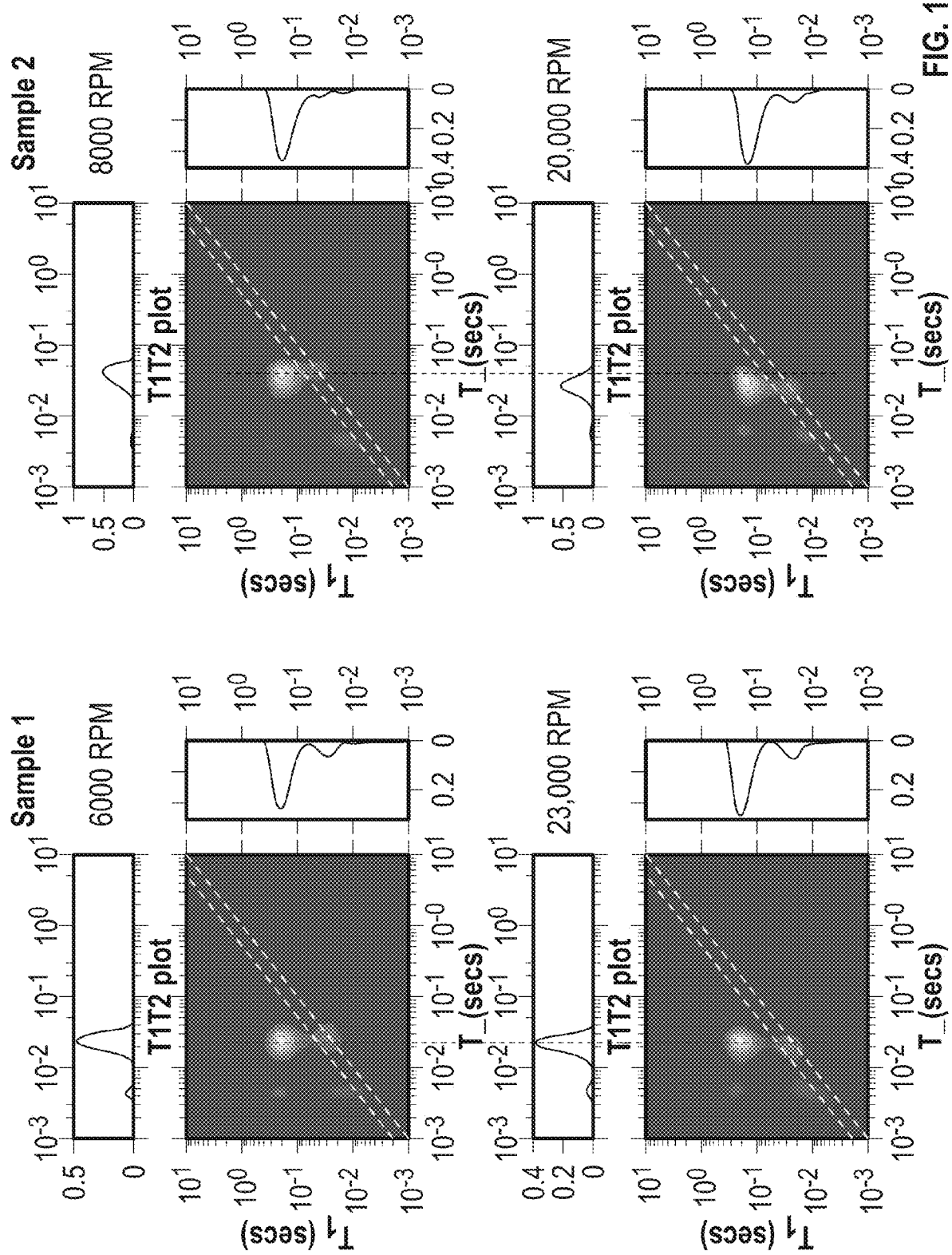
FIG. 12 depicts T1T2 plots for first and second drilling fluid samples each of which was sheared at relatively lower and relatively higher speeds as indicated.

FIG. 12 depicts T1T2 plots for first and second drilling fluid samples each of which was sheared at relatively lower and relatively higher speeds as indicated. As indicated, the samples sheared at higher speeds (23,000 rpm for sample 1 and 20,000 for sample 2) exhibit substantially shortened T1 and T2 relaxation times (note that the peaks are shifted to shorter T1 and T2 times—towards the lower left of the plot). The dashed lines in the plots provide a visual guide. Standards and best practices for sample preparation may be evaluated with such NMR measurements.

While the above described NMR measurements were made at ambient temperature and pressure, it will be understood that it may be desirable to evaluate drilling fluids under high temperature and/or high pressure conditions that are more representative of the actual service conditions encountered by the fluid. U.S. Provisional Patent Application 62/821,172 discloses a fluid flowline suitable for high temperature and high pressure measurements while U.S. Patent Publication 2017/0248732 discloses miniaturized electronics suitable for such measurements.

Figure 13:
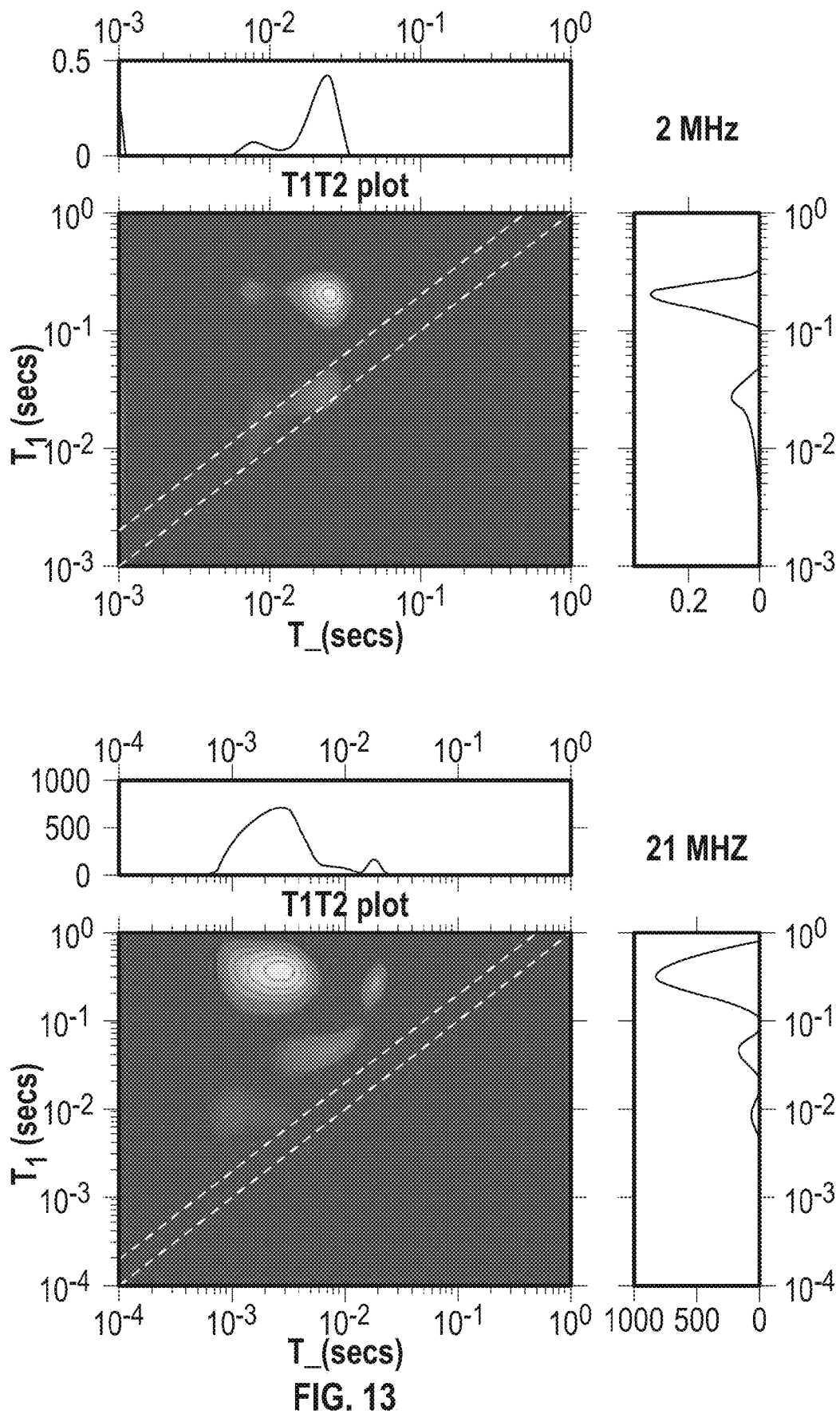
FIG. 13 depicts T1T2 plots obtained in a 2 MHz laboratory system and in a 21 MHz mobile high temperature high pressure system for the same drilling fluid.

FIG. 13 depicts T1T2 plots obtained in a 2 MHz laboratory system and in a 21 MHz mobile high temperature high pressure system for the same drilling fluid. The T1T2 plots obtained from the high temperature high pressure measurement (HTHP) system showed the same T2 and substantially longer T1 relaxation times.

Figure 14:
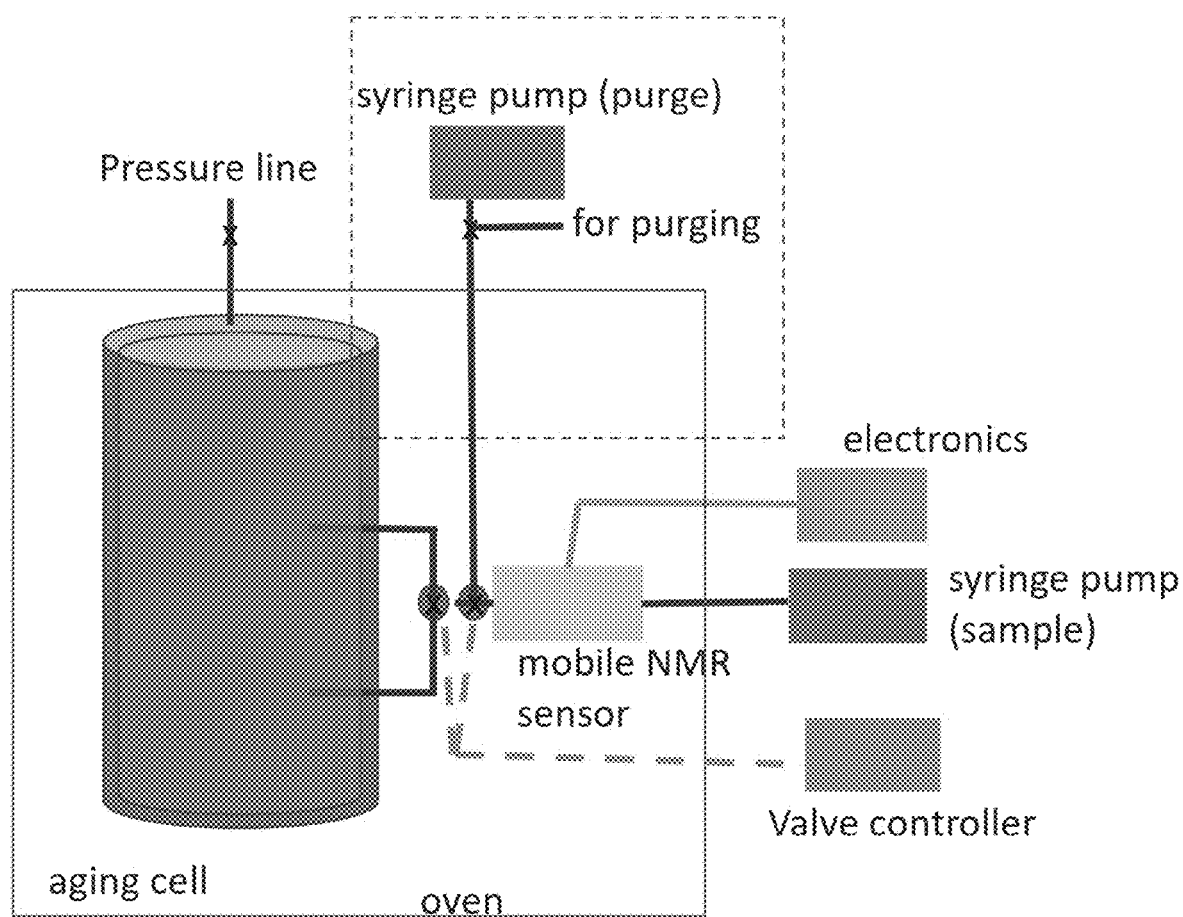
Figure 15:
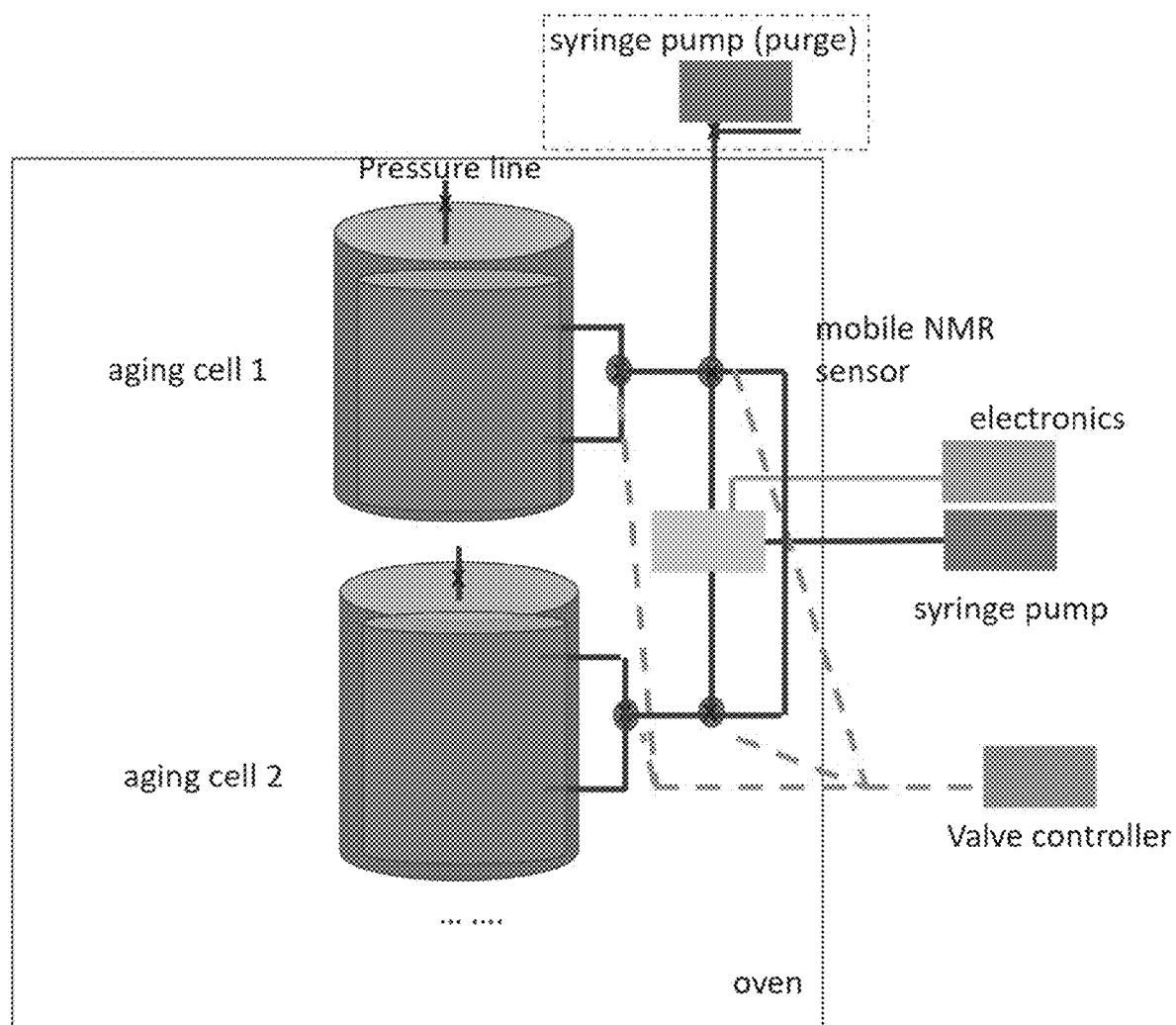
Figure 16:
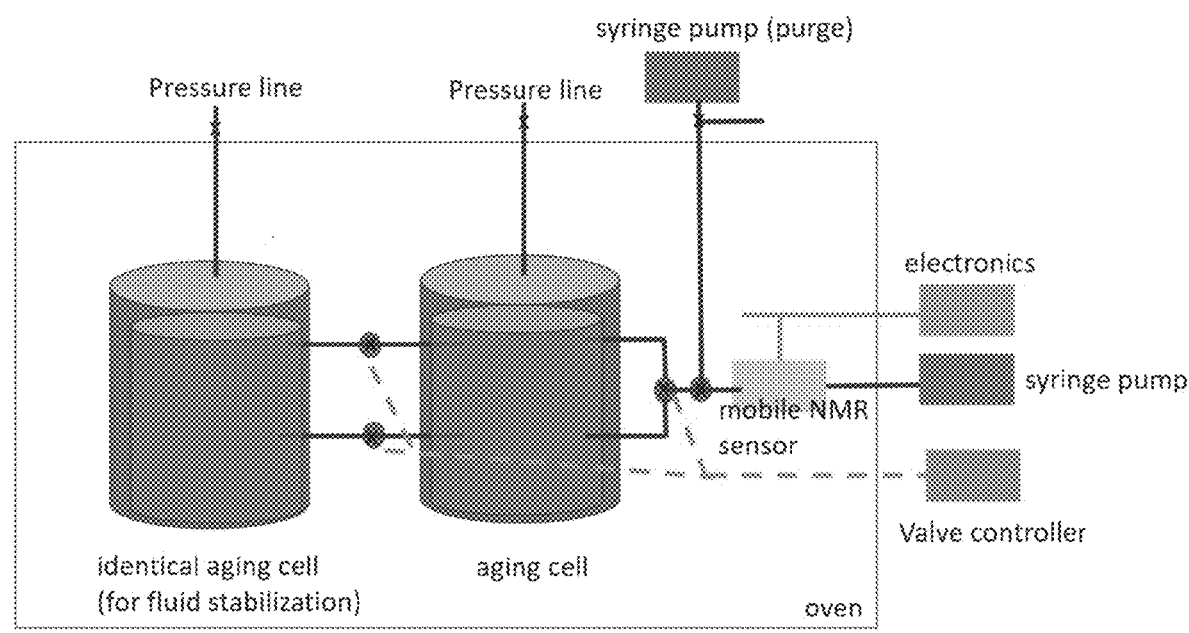

To utilize the portable HTHP system for evaluating in-situ drilling fluids in a mud lab, small fluid samples may be drawn at various heights of an evaluation cell, for example, as shown in FIGS. 14-16. In practice, the fluid volume used in a drilling fluid aging cell may be hundreds of mL (e.g., 350 mL) while the sample volume required for these "micro" NMR measurements may be less than µL. In such embodiments less than 0.01% of the drilling fluid in the aging cell is required for each NMR measurement. One example measurement system for making such micro NMR measurements is disclosed in commonly assigned U.S. patent application Ser. No. 16/825,736.

In each measurement cycle, the fluid at the higher depth is drawn to the NMR device, analyzed, and pushed back to the main vessel (or purged out through a separate hydraulic line); the procedure is then repeated at the lower depth. Under static conditions, the drilling fluid changes over time and space, and the kinetics may be captured through measured NMR spectra of regularly sampled fluids. FIG. 14 shows a configuration in which samples are collected at 2 heights on one aging cell. FIG. 15 shows a configuration in which samples are collected at 2 heights on two aging cells. FIG. 16 shows a configuration in which samples are collected at 2 heights on the aging cells.

It will be understood that the disclosure includes numerous embodiments. These embodiments include, but are not limited to, the following embodiments.

In a first embodiment, a method for evaluating drilling fluid includes (a) obtaining a sample of the drilling fluid; (b) causing a nuclear magnetic resonance (NMR) measurement system to make a plurality of an NMR measurements of the sample at a corresponding plurality of times while the sample ages; (c) inverting each of the plurality of NMR measurements to obtain a corresponding plurality of T1T2 plots; and (d) processing the plurality of T1T2 plots in combination to compute an NMR stability index of the drilling fluid, the NMR stability index being indicative of a stability of the drilling fluid during aging.

A second embodiment may include the first embodiment wherein (d) comprises evaluating changes in positions and amplitudes of corresponding peaks in the T1T2 plots to quantify changes in the sample with time.

A third embodiment may include any one of the first through second embodiments wherein an increasing stability index indicates an increasing tendency of the sample to sag with time.

A fourth embodiment may include any one of the first through third embodiments wherein the stability index comprises a Bhattacharyya distance ($D_B$) calculation.

A fifth embodiment may include any one of the first through fourth embodiments wherein the stability index is computed in (d) using the following mathematical equation:

$$SI_{NMR}(k) = \sum_{k=1}^{N} -\ln\left[\sum \sqrt{sp_1 * sp_k}\right]$$

wherein $SI_{NMR}(k)$ represents the NMR stability index of the sample of drilling fluid where k=1, 2, ..., N sequential measurements over time, $sp_1$ and $sp_k$ represent the T1T2 plots obtained in (c), and * represents element-wise multiplication.

A sixth embodiment may include any one of the first through fifth embodiments wherein (b) further comprises aging the sample of drilling fluid at an elevated temperature greater than about 100 degrees C.; making the plurality of NMR measurements at the elevated temperature; and wherein the NMR system employs a permanent magnet having a temperature about equal to the elevated temperature.

A seventh embodiment may include any one of the first through sixth embodiments wherein: the sample obtained in (a) includes a first sample including a water based brine and a second sample includes a deuterium oxide ($D_2O$) based brine; (b) further comprises causing the NMR system to make a plurality of NMR measurements of each of the first and second samples at a corresponding plurality of times while the samples age; and (d) further comprises comparing the T1T2 plots obtained from the first sample with the T1T2 plots obtained from the second sample to separate contributions from oil based components and water based components of the drilling fluid.

An eighth embodiment may include any one of the first through seventh embodiments wherein (d) further comprises computing first and second stability indexes, the first stability index computed using the T1T2 plots obtained from the NMR measurements made on the first sample and the second stability index computed using the T1T2 plots obtained from the NMR measurements made on the second sample.

In a ninth embodiment a method for evaluating drilling fluid includes (a) obtaining a sample of the drilling fluid; (b) titrating at least first and second concentrations of an additive into corresponding first and second sub-samples of the sample of the drilling fluid to obtain corresponding first and second modified samples; (c) causing a nuclear magnetic resonance measurement (NMR) system to make NMR measurements of the sample of drilling fluid and the first and second modified samples; (d) inverting each of the NMR measurements to obtain a corresponding plurality of T1T2 plots; and (e) evaluating the T1T2 plots to characterize the drilling fluid.

A tenth embodiment may include the ninth embodiment wherein said evaluating in (e) comprises evaluating changes in positions and amplitudes of corresponding peaks in the T1T2 plots to separate peaks related to oil-based components of the drilling fluid and water based components of the drilling fluid.

An eleventh embodiment may include any one of the ninth through tenth embodiments wherein the additive comprises a component of the drilling fluid; and said evaluating in (e) comprises estimating at least one of an oil water ratio, a solid content of the drilling fluid, and a fluid density of the drilling fluid.

A twelfth embodiment may include the eleventh embodiment, wherein the solid content of the drilling fluid is estimated from an amplitude of one or more echoes in the NMR measurements made in (c).

A thirteenth embodiment may include any one of the ninth through twelfth embodiments wherein the additive is selected from oil, brine, barite, an emulsifier, an anti-sag agent, and a wetting agent, and (e) further comprises (i) determining a mathematical correlation between the additive concentrations in (b) and features of the T1T2 plots obtained in (d) and (ii) using the correlation to compute at least one of an oil water ratio, a solid content, an emulsifier concentration, and/or a wetting agent concentration of the original drilling fluid sample obtained in (a).

A fourteenth embodiment may include any one of the ninth through thirteenth embodiments wherein the additive is oil.

A fifteenth embodiment may include any one of the ninth through fourteenth embodiments wherein the sample of drilling fluid obtained in (a) is a multi-phase fluid sample.

A sixteenth embodiment may include any one of the ninth through fifteenth embodiments wherein: the sample of drilling fluid obtained in (a) has an elevated temperature greater than about 100 degrees C.; and the NMR system employs a permanent magnet having a temperature about equal to the elevated temperature.

A seventeenth embodiment may include any one of the ninth through sixteenth embodiments wherein: the sample obtained in (a) includes a first sample including a water based brine and a second sample includes a deuterium oxide ($D_2O$) based brine; (b) further comprises titrating at least first and second concentrations of an additive into corresponding first and second sub-samples of the first sample and into corresponding first and second sub-samples of the second sample to obtain corresponding first and second modified first samples and first and second modified second samples; (c) causing the NMR system to make NMR measurements of the first and second samples, first and second modified first samples, and the first and second modified second samples; and (e) further comprises comparing the T1T2 plots obtained from said first samples with the T1T2 plots obtained from said second samples to separate contributions from oil based components and water based components of the drilling fluid.

In an eighteenth embodiment a method for evaluating drilling fluid includes (a) obtaining a sample of the drilling fluid and a modified sample of the drilling fluid, wherein the sample comprises a water based brine and the modified sample comprises a deuterium oxide ($D_2O$) based brine replacing the water based brine; (b) causing a nuclear magnetic resonance (NMR) measurement system to make corresponding NMR measurements of the sample and the modified sample; (c) inverting each of the NMR measurements to obtain corresponding T1T2 plots; and (d) comparing peaks in the T1T2 plots obtained from the sample and the modified sample to separate contributions from oil based components and water based components of the sample of drilling fluid.

A nineteenth embodiment may include the eighteenth embodiment wherein: (b) further comprises aging the sample and the modified sample to obtain an aged sample and an aged modified sample and causing the NMR measurement system to make corresponding NMR measurements of the aged sample and the aged modified sample; and (d) further comprises comparing peaks in the T1T2 plots obtained from the sample, the aged sample, the modified sample, and the aged modified sample to identify phase separation in the sample and in the aged sample.

A twentieth embodiment may include any one of the eighteenth or nineteenth embodiments wherein the sample of drilling fluid and the modified sample of drilling fluid further comprise at least an oil based component and barite.

Although NMR characterization and monitoring of drilling fluids has been described in detail, it should be understood that various changes, substitutions and alternations can be made herein without departing from the spirit and scope of the disclosure as defined by the appended claims.

What is claimed is:

1. A method for evaluating drilling fluid, the method comprising:
   (a) obtaining a sample of the drilling fluid;
   (b) causing a nuclear magnetic resonance (NMR) measurement system to make a plurality of an NMR measurements of the sample at a corresponding plurality of times while the sample ages;
   (c) inverting each of the plurality of NMR measurements to obtain a corresponding plurality of T1T2 plots; and
   (d) processing the plurality of T1T2 plots in combination to compute an NMR stability index of the drilling fluid, the NMR stability index being indicative of a stability of the drilling fluid during aging.

2. The method of claim 1, wherein (d) comprises evaluating changes in positions and amplitudes of corresponding peaks in the T1T2 plots to quantify changes in the sample with time.

3. The method of claim 1, wherein an increasing stability index indicates an increasing tendency of the sample to sag with time.

4. The method of claim 1, wherein the stability index comprises a Bhattacharyya distance ($D_B$) calculation.

5. The method of claim 1, wherein the stability index is computed in (d) using the following mathematical equation:

$$SI_{NMR}(k) = \sum_{k=1}^{N} -\ln\left[\sum \sqrt{sp_1 * sp_k}\right]$$

wherein $SI_{NMR}(k)$ represents the NMR stability index of the sample of drilling fluid where k=1, 2, . . . , N sequential measurements over time, $sp_1$ and $sp_k$ represent the T1T2 plots obtained in (c), and * represents element-wise multiplication.

6. The method of claim 1, wherein (b) further comprises aging the sample of drilling fluid at an elevated temperature greater than about 100 degrees C.; making the plurality of NMR measurements at the elevated temperature; and
wherein the NMR system employs a permanent magnet having a temperature about equal to the elevated temperature.

7. The method of claim 1, wherein:
the sample obtained in (a) includes a first sample including a water based brine and a second sample includes a deuterium oxide ($D_2O$) based brine;
(b) further comprises causing the NMR measurement system to make a plurality of NMR measurements of each of the first and second samples at a corresponding plurality of times while the samples age; and
(d) further comprises comparing the T1T2 plots obtained from the first sample with the T1T2 plots obtained from the second sample to separate contributions from oil based components and water based components of the drilling fluid.

8. The method of claim 7, wherein (d) further comprises computing first and second stability indexes, the first stability index computed using the T1T2 plots obtained from the NMR measurements made on the first sample and the second stability index computed using the T1T2 plots obtained from the NMR measurements made on the second sample.

9. A method for evaluating drilling fluid, the method comprising:
   (a) obtaining a sample of the drilling fluid;
   (b) titrating at least first and second concentrations of an additive into corresponding first and second sub-samples of the sample of the drilling fluid to obtain corresponding first and second modified samples;
   (c) causing a nuclear magnetic resonance measurement (NMR) system to make NMR measurements of the sample of drilling fluid and the first and second modified samples;
   (d) inverting each of the NMR measurements to obtain a corresponding plurality of T1T2 plots; and
   (e) evaluating the T1T2 plots to characterize the drilling fluid.

10. The method of claim 9, wherein said evaluating in (e) comprises evaluating changes in positions and amplitudes of corresponding peaks in the T1T2 plots to separate peaks related to oil-based components of the drilling fluid and water based components of the drilling fluid.

11. The method of claim 10, wherein
the additive comprises a component of the drilling fluid; and
said evaluating in (e) comprises estimating at least one of an oil water ratio, a solid content of the drilling fluid, and a fluid density of the drilling fluid.

12. The method of claim 11, wherein the solid content of the drilling fluid is estimated from an amplitude of one or more echoes in the NMR measurements made in (c).

13. The method of claim 9, wherein:
the additive is selected from oil, brine, barite, an emulsifier, an anti-sagging agent, and a wetting agent; and
(e) further comprises (i) determining a mathematical correlation between the additive concentrations in (b) and features of the T1T2 plots obtained in (d) and (ii) using the correlation to compute at least one of an oil water ratio, a solid content, an emulsifier concentration, and/or a wetting agent concentration of the original drilling fluid sample obtained in (a).

14. The method of claim 9, wherein the additive is oil.

15. The method claim 9, wherein the sample of drilling fluid obtained in (a) is a multi-phase fluid sample.

16. The method of claim 9, wherein:

the sample of drilling fluid obtained in (a) has an elevated temperature greater than about 100 degrees C.; and the NMR system employs a permanent magnet having a temperature about equal to the elevated temperature.

17. The method of claim 9, wherein:

the sample obtained in (a) includes a first sample including a water based brine and a second sample includes a deuterium oxide ($D_2O$) based brine;

(b) further comprises titrating at least first and second concentrations of an additive into corresponding first and second sub-samples of the first sample and into corresponding first and second sub-samples of the second sample to obtain corresponding first and second modified first samples and first and second modified second samples;

(c) causing the NMR system to make NMR measurements of the first and second samples, first and second modified first samples, and the first and second modified second samples; and (e) further comprises comparing the T1T2 plots obtained from said first samples with the T1T2 plots obtained from said second samples to separate contributions from oil based components and water based components of the drilling fluid.

18. A method for evaluating drilling fluid, the method comprising:

(a) obtaining a sample of the drilling fluid and a modified sample of the drilling fluid, wherein the sample comprises a water based brine and the modified sample comprises a deuterium oxide ($D_2O$) based brine replacing the water based brine;

(b) causing a nuclear magnetic resonance (NMR) measurement system to make corresponding NMR measurements of the sample and the modified sample;

(c) inverting each of the NMR measurements to obtain corresponding T1T2 plots; and (d) comparing peaks in the T1T2 plots obtained from the sample and the modified sample to separate contributions from oil based components and water based components of the sample of drilling fluid.

19. The method of claim 18, wherein:

(b) further comprises aging the sample and the modified sample to obtain an aged sample and an aged modified sample and causing the NMR measurement system to make corresponding NMR measurements of the aged sample and the aged modified sample; and (d) further comprises comparing peaks in the T1T2 plots obtained from the sample, the aged sample, the modified sample, and the aged modified sample to identify phase separation in the sample and in the aged sample.

20. The method of claim 18, wherein the sample of drilling fluid and the modified sample of drilling fluid further comprise an oil based component and barite.

\* \* \* \* \*